United States Patent
You et al.

(10) Patent No.: US 9,859,398 B2
(45) Date of Patent: *Jan. 2, 2018

(54) METHODS FOR FABRICATING SEMICONDUCTOR DEVICES HAVING FIN-SHAPED PATTERNS BY SELECTIVELY REMOVING OXIDIZED PORTIONS OF THE FIN-SHAPED PATTERNS

(71) Applicant: Samsung Electronics Co., Ltd., Suwon-si, Gyeonggi-do (KR)

(72) Inventors: Jung-Gun You, Ansan-si (KR); Se-Wan Park, Seoul (KR); Seung-Woo Do, Yongin-si (KR); In-Won Park, Hwaseong-si (KR); Sug-Hyun Sung, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/438,868

(22) Filed: Feb. 22, 2017

(65) Prior Publication Data

US 2017/0162670 A1     Jun. 8, 2017

Related U.S. Application Data

(63) Continuation of application No. 14/968,999, filed on Dec. 15, 2015, now Pat. No. 9,620,406.

(30) Foreign Application Priority Data

Jan. 27, 2015   (KR) .................. 10-2015-0012630

(51) Int. Cl.
*H01L 29/66*   (2006.01)
*H01L 21/306*  (2006.01)
(Continued)

(52) U.S. Cl.
CPC .... *H01L 29/66545* (2013.01); *H01L 21/3085* (2013.01); *H01L 21/30604* (2013.01);
(Continued)

(58) Field of Classification Search
CPC ......... H01L 21/76224; H01L 21/30604; H01L 21/3085; H01L 29/66545; H01L 29/785; H01L 29/66795
See application file for complete search history.

(56) References Cited

U.S. PATENT DOCUMENTS 6,642,090 B1   11/2003   Fried
6,913,969 B2   7/2005    Yoo
(Continued)

FOREIGN PATENT DOCUMENTS

JP   2008-311409 A    12/2008
KR   1020070113091 A  11/2007

*Primary Examiner* — Michael Jung
(74) *Attorney, Agent, or Firm* — Myers Bigel, P.A.

(57) ABSTRACT

A method for fabricating a semiconductor device is provided. The method includes forming a first fin-shaped pattern including an upper part and a lower part on a substrate, forming a second fin-shaped pattern by removing a part of the upper part of the first fin-shaped pattern, forming a dummy gate electrode intersecting with the second fin-shaped pattern on the second fin-shaped pattern, and forming a third fin-shaped pattern by removing a part of an upper part of the second fin-shaped pattern after forming the dummy gate electrode, wherein a width of the upper part of the second fin-shaped pattern is smaller than a width of the upper part of the first fin-shaped pattern and is greater than a width of an upper portion of the third fin-shaped pattern.

13 Claims, 35 Drawing Sheets

(51) Int. Cl.
  H01L 29/417 (2006.01)
  H01L 21/762 (2006.01)
  H01L 21/308 (2006.01)
  H01L 29/78 (2006.01)
  H01L 29/165 (2006.01)

(52) U.S. Cl.
  CPC .. H01L 21/76224 (2013.01); H01L 29/41766 (2013.01); H01L 29/6681 (2013.01); H01L 29/66795 (2013.01); H01L 29/785 (2013.01); H01L 29/165 (2013.01); H01L 29/7848 (2013.01)

(56) References Cited

U.S. PATENT DOCUMENTS

| | | | |
|---|---|---|---|
| 7,342,280 B2 | 3/2008 | Yoo | |
| 7,344,949 B2 | 3/2008 | Yoo | |
| 7,560,759 B2 | 7/2009 | Kang et al. | |
| 7,666,741 B2 | 2/2010 | Li et al. | |
| 7,678,648 B2 | 3/2010 | Torek et al. | |
| 7,812,375 B2 | 10/2010 | Lee et al. | |
| 7,833,875 B2 | 11/2010 | Kim et al. | |
| 7,928,495 B2 | 4/2011 | Kim et al. | |
| 8,247,859 B2 | 8/2012 | Kim et al. | |
| 8,519,465 B2 | 8/2013 | Kim et al. | |
| 8,765,533 B2 | 7/2014 | Hsieh et al. | |
| 8,969,939 B2 | 3/2015 | Kim et al. | |
| 9,362,405 B1 | 6/2016 | Jacob | |
| 9,653,584 B2 * | 5/2017 | Glass | H01L 29/66818 |
| 2011/0068405 A1 | 3/2011 | Yuan et al. | |
| 2012/0083127 A1 | 4/2012 | Clark et al. | |
| 2013/0056826 A1 | 3/2013 | Liu et al. | |
| 2013/0200483 A1 | 8/2013 | Tung | |
| 2013/0270641 A1 | 10/2013 | Chi | |
| 2013/0270652 A1 | 10/2013 | Liaw | |
| 2013/0320461 A1 | 12/2013 | Kim et al. | |
| 2013/0341638 A1 * | 12/2013 | Liao | H01L 29/66484 257/77 |
| 2014/0099774 A1 | 4/2014 | Vincent | |
| 2014/0170839 A1 | 6/2014 | Brunco | |
| 2015/0001468 A1 * | 1/2015 | Huang | H01L 29/66977 257/24 |
| 2015/0014808 A1 | 1/2015 | Tsai | |
| 2015/0137320 A1 | 5/2015 | Kim et al. | |
| 2015/0179768 A1 | 6/2015 | Chen | |
| 2015/0249127 A1 | 9/2015 | Xie | |
| 2015/0380241 A1 | 12/2015 | Yu | |
| 2016/0240651 A1 | 8/2016 | Lee | |

* cited by examiner

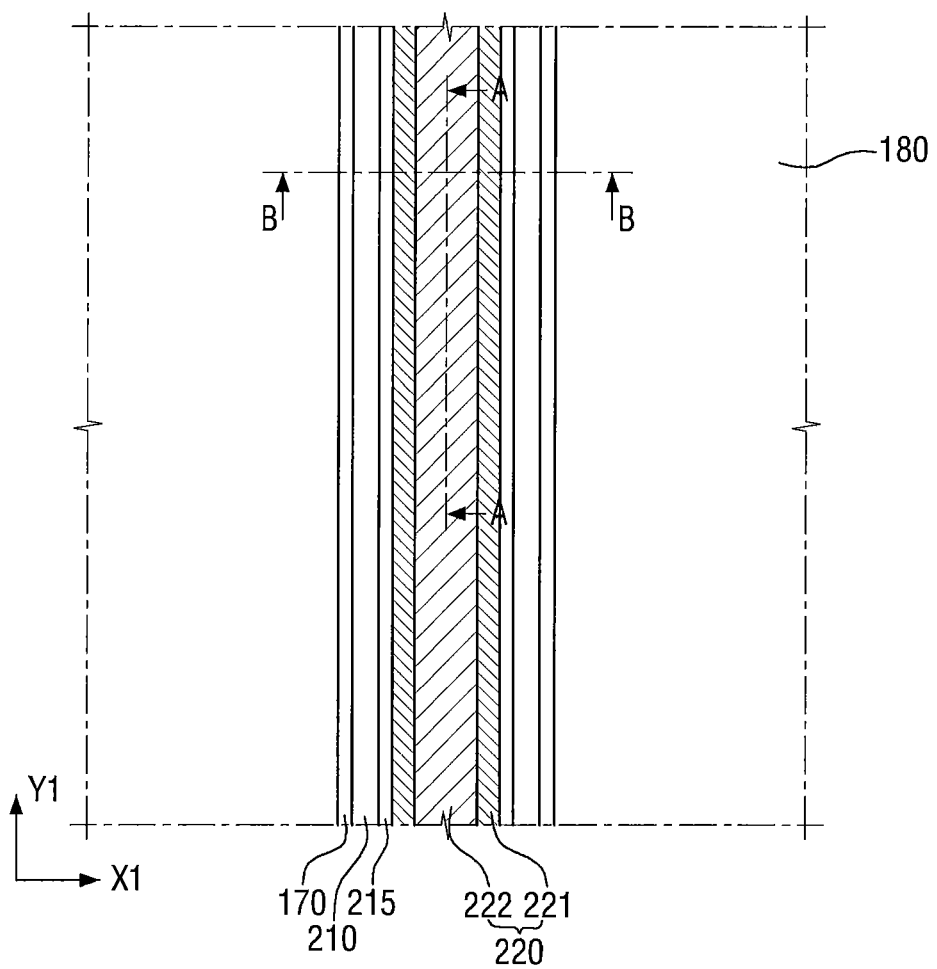

METHODS FOR FABRICATING SEMICONDUCTOR DEVICES HAVING FIN-SHAPED PATTERNS BY SELECTIVELY REMOVING OXIDIZED PORTIONS OF THE FIN-SHAPED PATTERNS

CROSS-REFERENCE TO RELATED APPLICATION

This U.S. non-provisional patent application claims priority as a continuation application of U.S. patent application Ser. No. 14/968,999, filed Dec. 15, 2015, now U.S. Pat. No. 9,620,406, which, in turn, claims priority from Korean Patent Application No. 10-2015-0012630, filed on Jan. 27, 2015 in the Korean Intellectual Property Office, the entire contents of which are incorporated by reference herein.

BACKGROUND

1. Technical Field

The inventive concepts relate to methods for fabricating semiconductor devices, and more specifically, to methods for fabricating semiconductor devices which adjust a channel shape of a fin-shaped field effect transistor (FINFET).

2. Description of the Related Art

One technique for increasing the integration density of semiconductor devices is to use multi-gate transistors in which a fin-shaped semiconductor body is formed on a substrate and a gate is formed on a surface of the semiconductor body. Since such multi-gate transistors utilize a three-dimensional channel, they may be more readily scaled. Multi-gate transistors also may exhibit improved current control capability without increasing the gate length of the transistor. Multi-gate transistors may also reduce or eliminate a short channel effect (SCE) in which a potential of the channel region is affected by the drain voltage.

SUMMARY

Aspects of the inventive concepts provide methods for fabricating semiconductor devices which may exhibit improved performance by enhancing a width effect through adjustment of a channel shape of a fin-shaped field effect transistor (FINFET).

Aspects of the inventive concepts are not limited to the above-mentioned aspects, and other aspects that have not been mentioned will be clearly understood by those skilled in the art from the following description.

According to an aspect of the inventive concepts, there is provided a method for fabricating a semiconductor device, the method comprising forming a first fin-shaped pattern that includes an upper part and a lower part on a substrate, forming a second fin-shaped pattern by removing a portion of the upper part of the first fin-shaped pattern, forming a dummy gate electrode that intersects the second fin-shaped pattern on the second fin-shaped pattern, and forming a third fin-shaped pattern by removing a portion of an upper part of the second fin-shaped pattern after forming the dummy gate electrode, wherein a width of the upper part of the second fin-shaped pattern at a first height above a lower surface of the substrate is smaller than a width of the upper part of the first fin-shaped pattern at the first height and is greater than a width of an upper portion of the third fin-shaped pattern at the first height.

In some embodiments, forming the second fin-shaped pattern includes forming a first oxide film along a profile of the upper part of the first fin-shaped pattern, and then removing the first oxide film.

In some embodiments, forming the first oxide film includes oxidizing a portion of the upper part of the first fin-shaped pattern.

In some embodiments, forming the third fin-shaped pattern includes forming a second oxide film along a profile of the upper part of the second fin-shaped pattern before forming the dummy gate electrode, and removing the second oxide film after forming the dummy gate electrode.

In some embodiments, forming the second oxide film includes oxidizing a portion of the upper part of the second fin-shaped pattern.

In some embodiments, the method may further comprise forming a third oxide film along a profile of the upper part of the third fin-shaped pattern by oxidizing a portion of the upper part of the third fin-shaped pattern.

In some embodiments, the first fin-shaped pattern includes a sidewall, an upper surface and a corner portion in which the sidewall and the upper surface meet. The method may further comprise rounding the corner portion by etching the first fin-shaped pattern before forming the second fin-shaped pattern.

In some embodiments, the method may further comprise forming a field insulating film on the substrate before rounding the corner portion. The upper part of the first fin-shaped pattern protrudes above an upper surface of the field insulating film.

In some embodiments, forming the first fin-shaped pattern includes forming a fourth fin-shaped pattern including an upper part and a lower part on a substrate, forming a field insulating film that directly contacts the lower part of the fourth fin-shaped and that does not directly contact the upper part of the fourth fin-shaped pattern, and removing a portion of the upper part of the fourth fin-shaped pattern after forming the field insulating film.

In some embodiments, forming the first fin-shaped pattern includes forming an oxide film along a profile of the upper part of the fourth fin-shaped pattern, and removing the oxide film.

In some embodiments, the width of the upper part of the first fin-shaped pattern at the first height is smaller than a width of the upper part of the fourth fin-shaped pattern at the first height.

In some embodiments, the fourth fin-shaped pattern includes a sidewall, a upper surface and a corner portion in which the sidewall and the upper surface meet. The method may further comprise rounding the corner portion by etching the fourth fin-shaped pattern before forming the first fin-shaped pattern.

In some embodiments, the method may further comprise forming a gate electrode that intersects the third fin-shaped pattern on the third fin-shaped pattern. The forming of the gate electrode includes forming a trench by removing the dummy gate electrode, and forming a conductive material in the trench after forming the third fin-shaped pattern.

In some embodiments, forming of the first fin-shaped pattern includes forming a field insulating film on the substrate, the field insulating film directly contacting the lower part of the first fin-shaped pattern and not directly contacting the upper part of the first fin-shaped pattern.

In some embodiments, forming of the second fin-shaped pattern includes modifying a profile of sidewalls of the first fin-shaped pattern to form the second fin-shaped pattern, and forming of the third fin-shaped pattern includes modifying a profile of sidewalls of the second fin-shaped pattern to form the third fin-shaped pattern.

In some embodiments, the method may further comprise forming recesses in the second fin-shaped pattern by etching both sides of the dummy gate electrode, and then forming source/drains in the respective recesses prior to forming the third fin-shaped pattern.

According to another aspect of the inventive concepts, there is provided a method for fabricating a semiconductor device, the method comprising forming a first fin-shaped pattern which includes an upper part that protrudes above an upper surface of a field insulating film, and a lower part that is surrounded by the field insulating film, etching corner portions of the first fin-shaped pattern at which an upper surface and sidewalls of the first fin-shaped pattern meet to round the corner portions of the first fin-shaped pattern, forming a second fin-shaped pattern by modifying a profile of the sidewalls of the first fin-shaped pattern that includes the rounded corner portion, forming a dummy gate electrode that intersects the second fin-shaped pattern on the second fin-shaped pattern, and forming a third fin-shaped pattern by modifying a profile of sidewalls of the second fin-shaped pattern that vertically overlap the dummy gate electrode.

In some embodiments, forming the second fin-shaped pattern includes forming a first oxide film along the profile of the upper part of the first fin-shaped pattern that includes the rounded corner portion by oxidizing a portion of the upper part of the first fin-shaped pattern, and removing the first oxide film.

In some embodiments, forming the third fin-shaped pattern includes forming a second oxide film along a profile of an upper part of the second fin-shaped pattern by oxidizing a portion of the upper part of the second fin-shaped pattern before forming the dummy gate electrode, and removing at least a portion of the second oxide film after forming the dummy gate electrode to form the third fin-shaped pattern.

In some embodiments, the method may further comprise forming a trench exposing the portion of the second oxide film by removing the dummy gate electrode prior to removing at least a portion of the second oxide film.

In some embodiments, the method may further comprise forming a third oxide film along a profile of the third fin-shaped pattern that is exposed by the trench, and forming a gate electrode in the trench on the third oxide film.

In some embodiments, a width of an upper part of the second fin-shaped pattern at a first height above a lower surface of the substrate is smaller than a width of the upper part of the first fin-shaped pattern at the first height and is greater than a width of an upper part of the third fin-shaped pattern at the first height.

According to still another aspect of the inventive concepts, there is provided a method for fabricating a semiconductor device, the method comprising forming a first fin-shaped pattern including an upper part and a lower part on a substrate, forming a first oxide film along a profile of the first fin-shaped pattern by oxidizing a portion of the first fin-shaped pattern, forming a second fin-shaped pattern by removing the first oxide film, forming a second oxide film along a profile of the second fin-shaped pattern by oxidizing a portion of the second fin-shaped pattern, and forming a first gate electrode that intersects the second fin-shaped pattern on the second oxide film.

In some embodiments, forming the first fin-shaped pattern includes forming a field insulating film on the substrate, the field insulating film directly contacting the lower part of the fin-shaped pattern and not directly contacting the upper part of the first fin-shaped pattern.

In some embodiments, the first oxide film is formed along the profile of the upper part of the first fin-shaped pattern, and the second oxide film is formed along the profile of the upper part of the second fin-shaped pattern.

In some embodiments, the method may further comprise etching a corner portion of the first fin-shaped pattern at which an upper surface and a sidewall of the first fin-shaped pattern meet to round the corner portion of the first fin-shaped pattern prior to forming the first oxide film.

In some embodiments, forming the first fin-shaped pattern includes forming a fourth fin-shaped pattern including an upper part and a lower part on the substrate, forming a field insulating film that directly contacts the lower part of the fourth fin-shaped pattern and that does not directly contact the upper part of the fourth fin-shaped pattern, forming a fourth oxide film along a profile of the fourth fin-shaped pattern by oxidizing a portion of the fourth fin-shaped pattern after forming the field insulating film, and removing the fourth oxide film.

In some embodiments, the fourth oxide film is formed along the profile of the upper part of the fourth fin-shaped pattern.

In some embodiments, the method may further comprise etching a corner portion at which an upper surface and a sidewall of the fourth fin-shaped pattern meet to round the corner portion of the fourth fin-shaped pattern prior to forming the fourth oxide film.

In some embodiments, a width of the upper part of the first fin-shaped pattern at a first height above a lower surface of the substrate is smaller than a width of the upper part of the fourth fin-shaped pattern at the first height and is greater than a width of an upper part of the second fin-shaped pattern at the first height.

In some embodiments, the method may further comprise forming a trench exposing the second oxide film by removing the first gate electrode, and forming a conductive material which fills the trench.

In some embodiments, the method may further comprise forming a third fin-shaped pattern by removing the second oxide film which is exposed by the trench, and forming a third oxide film along a profile of the third fin-shaped pattern which is exposed by the trench.

In some embodiments, forming the third oxide film includes oxidizing a portion of the third fin-shaped pattern.

According to still another aspect of the inventive concepts, there is provided a method for fabricating a semiconductor device, the method comprising forming a first fin-shaped pattern including an upper part and a lower part in a first region on a substrate, and forming a second fin-shaped pattern including an upper part and a lower part in a second region on the substrate, forming a third fin-shaped pattern by removing a portion of the upper part of the first fin-shaped pattern, forming a fourth fin-shaped pattern by removing a portion of the upper part of the second fin-shaped pattern, forming a first oxide film along a profile of the third fin-shaped pattern by oxidizing a portion of an upper part of the third fin-shaped pattern, forming a second oxide film along a profile of the fourth fin-shaped pattern by oxidizing a portion of an upper part of the fourth fin-shaped pattern, forming a mask pattern on the first region of the substrate, the mask pattern covering the third fin-shaped pattern with the first oxide film thereon, forming a fifth fin-shaped pattern by removing the second oxide film, forming a third oxide film along a profile of the fifth fin-shaped pattern by oxidizing a portion of an upper part of the fifth fin-shaped pattern, removing the mask pattern, and then forming a first dummy gate electrode that intersects the third fin-shaped pattern on the first oxide film and forming a second dummy gate electrode that intersects the fifth fin-shaped pattern on the third oxide film, and after forming the first and second dummy gate electrodes, forming a sixth fin-shaped pattern by removing at least a portion of the first oxide film and forming a seventh fin-shaped pattern by removing at least a portion of the third oxide film.

In some embodiments, forming the third fin-shaped pattern comprises forming a fourth oxide film along a profile of the upper part of the first fin-shaped pattern and then removing the fourth oxide film, and wherein forming the fourth fin-shaped pattern includes forming a fifth oxide film along a profile of the upper part of the second fin-shaped pattern, and then removing the fifth oxide film.

In some embodiments, the first fin-shaped pattern includes sidewalls, an upper surface and corner portions at which the sidewalls and the upper surface of the first fin-shaped pattern meet, and the second fin-shaped pattern includes sidewalls, an upper surface and corner portions at which the sidewalls and the upper surface of the second fin-shaped pattern meet. The method may further comprise before forming the third fin-shaped pattern and the fourth fin-shaped pattern, rounding the corner portions of the first fin-shaped pattern and the corner portions of the second fin-shaped pattern.

In some embodiments, the method may further comprise before rounding the corner portion of the first fin-shaped pattern and the corner portion of the second fin-shaped pattern, forming a field insulating film on the substrate. The upper part of the first fin-shaped pattern and the upper part of the second fin-shaped protrude above an upper surface of the field insulating film.

In some embodiments, forming the sixth fin-shaped pattern and the seventh fin-shaped pattern includes forming a first trench and a second trench which expose each of the first oxide film and the third oxide film, by removing the first dummy gate electrode and the second dummy gate electrode, and removing the first oxide film and the third oxide film which are exposed by the respective first and second trenches.

In some embodiments, the method may further comprise forming a fourth oxide film and a fifth oxide film along respective profiles of an upper part of the sixth fin-shaped pattern and an upper part of the seventh fin-shaped pattern, and forming a first gate electrode filling the first trench on the fourth oxide film and a second gate electrode filling the second trench on the fifth oxide film.

According to still another aspect of the inventive concepts, there is provided a method for fabricating a semiconductor device, the method comprising forming a first fin-shaped pattern and a field insulating film on a substrate, the field insulating film covering a lower part of the first fin-shaped pattern and an upper part of the first fin-shaped pattern protruding above the field insulating film; converting an outer portion of the upper part of the first fin-shaped pattern into a first oxide film; forming a second fin-shaped pattern by removing the first oxide film; converting an outer portion of an upper part of the second fin-shaped pattern that is exposed by the field insulating film into a second oxide film; and forming a third fin-shaped pattern by removing at least a portion of the second oxide film. A width of the upper part of the second fin-shaped pattern at a first height above a lower surface of the substrate is smaller than a width of the upper part of the first fin-shaped pattern at the first height and is greater than a width of an upper portion of the third fin-shaped pattern at the first height, and a second height of the second fin-shaped pattern above a lower surface of the substrate is smaller than a first height of the first fin-shaped pattern above the lower surface of the substrate and is greater than a third height of the third fin-shaped pattern above the lower surface of the substrate.

In some embodiments, the third fin-shaped pattern may extend in a first direction, and the method may further include forming an electrode structure on the substrate that extends in a second direction that crosses the first direction.

In some embodiments, a width of a lower part of the third fin-shaped pattern may be greater than a width of a top part of the third fin-shaped pattern and may be equal to a width of a lower part of the second fin-shaped pattern.

In some embodiments, the method may further include forming a dummy gate electrode that intersects the second fin-shaped pattern and then forming spacers on sidewalls of the dummy gate electrode and on the second oxide film. In such embodiments, removing at least the portion of the second oxide film may comprise removing the portion of the second oxide film that is exposed by the spacers.

In some embodiments, the method may further include rounding corner portions of at least one of the first through third fin-shaped patterns.

BRIEF DESCRIPTION OF THE DRAWINGS

The above and other aspects and features of the inventive concepts will become more apparent by the following detailed description of exemplary embodiments thereof with reference to the attached drawings, in which.

DETAILED DESCRIPTION OF THE EMBODIMENTS

The inventive concepts will now be described more fully hereinafter with reference to the accompanying drawings, in which example embodiments thereof are shown. The inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. The same reference numbers indicate the same components throughout the specification and drawings. In the attached figures, the thickness of some layers and regions may be exaggerated for clarity.

It will be understood that when an element or layer is referred to as being "on," "connected to," or "coupled to" another element or layer, it can be directly on, connected to or coupled to another element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element or component discussed below could be termed a second element or component without departing from the teachings of the inventive concepts.

The use of the terms "a" and "an" and "the" and similar referents in the context of describing the inventive concepts (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which the inventive concepts belong. It is noted that the use of any and all examples, or exemplary terms provided herein is intended merely to better illuminate the inventive concepts and is not a limitation on the scope of the inventive concepts unless otherwise specified.

A method for fabricating a semiconductor device according to an embodiment of the inventive concepts will be described with reference to FIGS. 1A to 14C, which illustrate intermediate structures that are formed during the method for fabricating a semiconductor device.

Figure 1A:
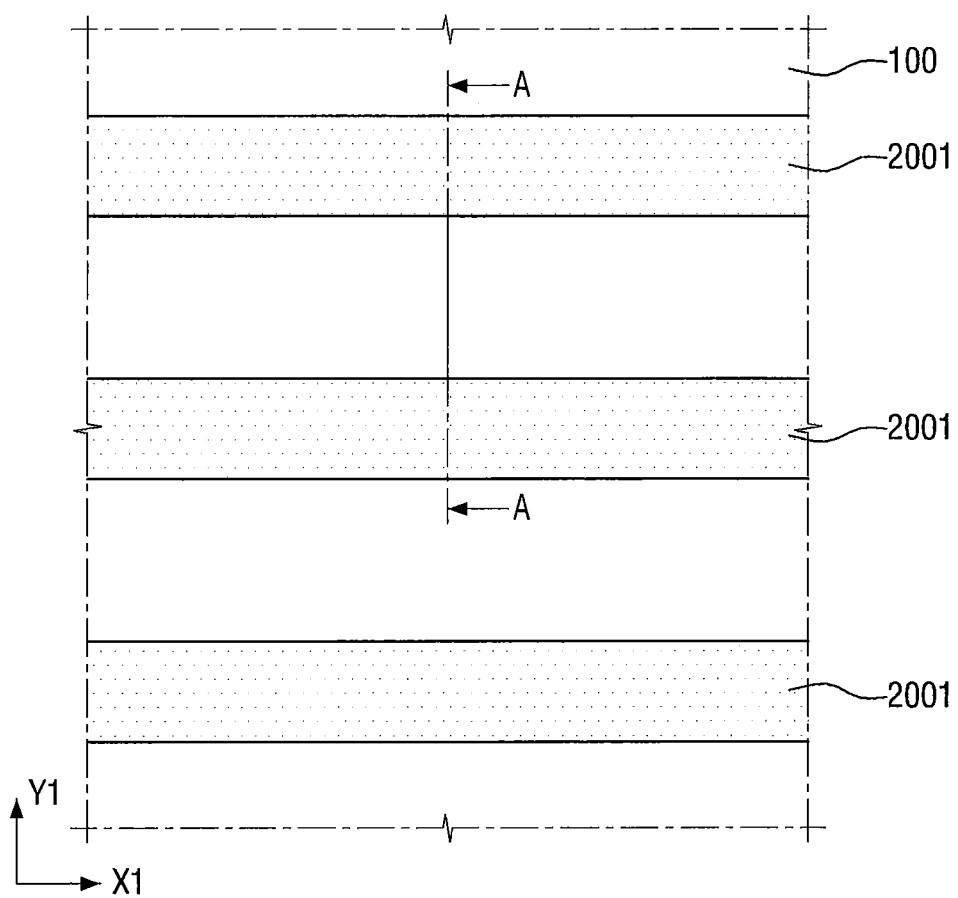
FIGS. 1A to 14C are intermediate-stage diagrams illustrating a method for fabricating a semiconductor device according to an embodiment of the inventive concepts.
Figure 1B:
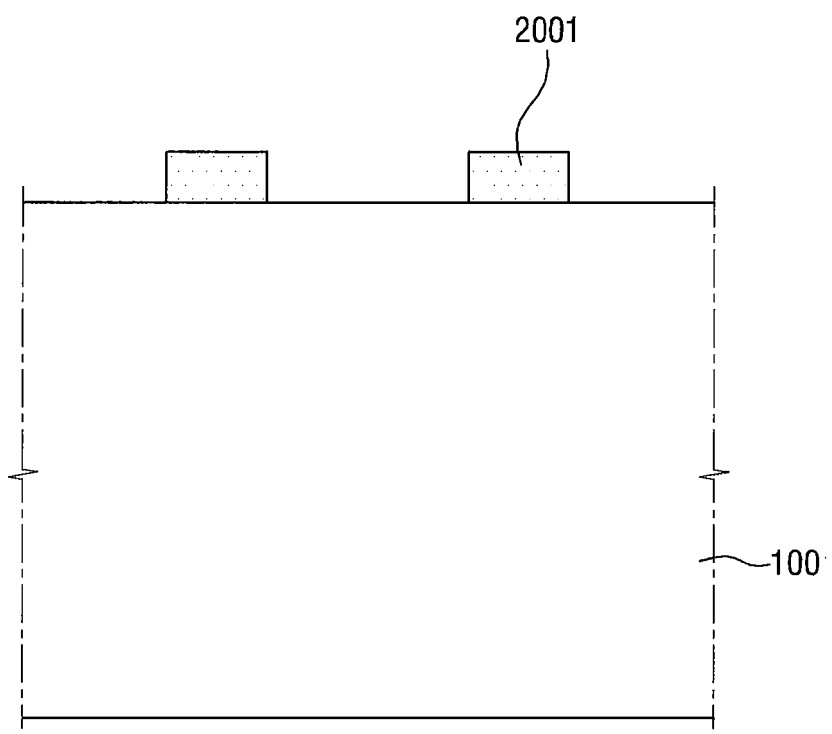
Figure 3A:
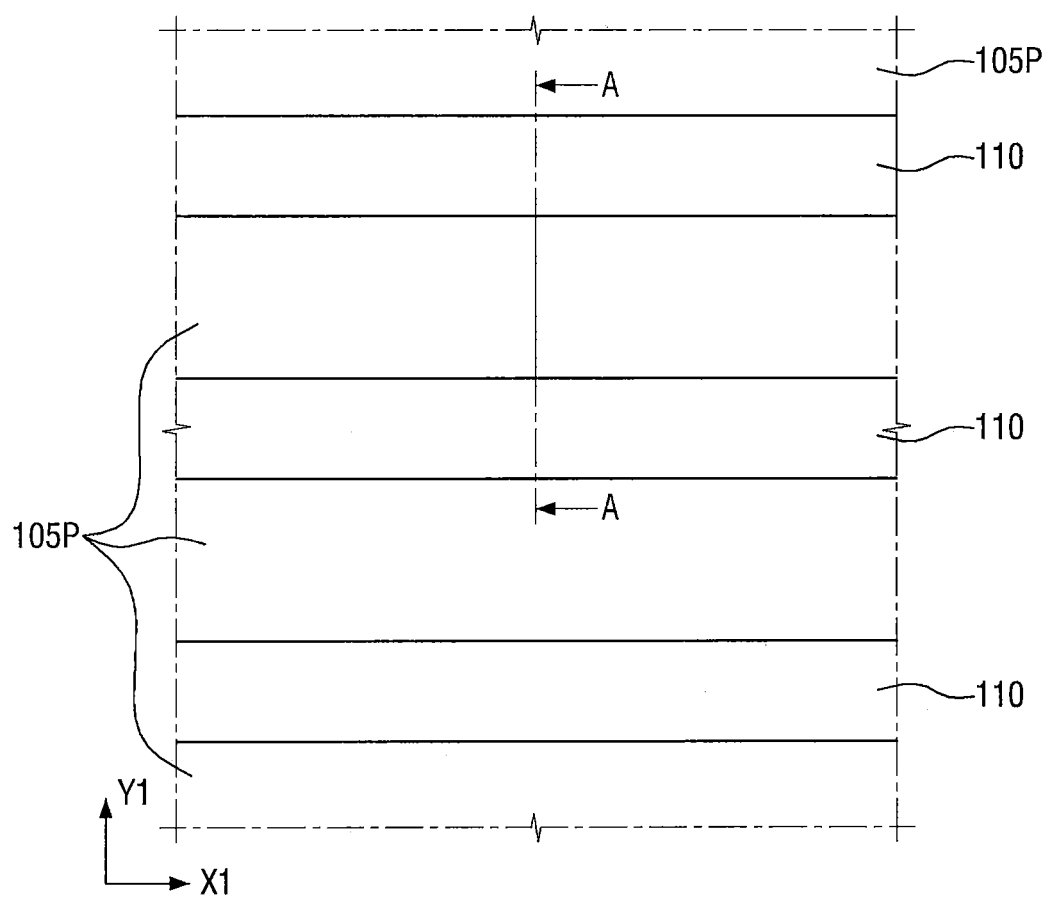
Figure 3B:
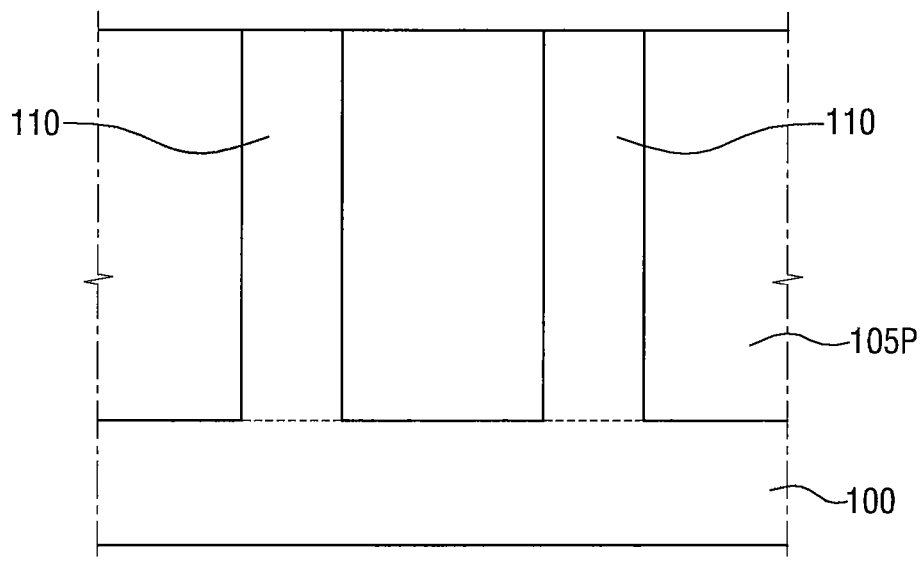
Figure 8A:
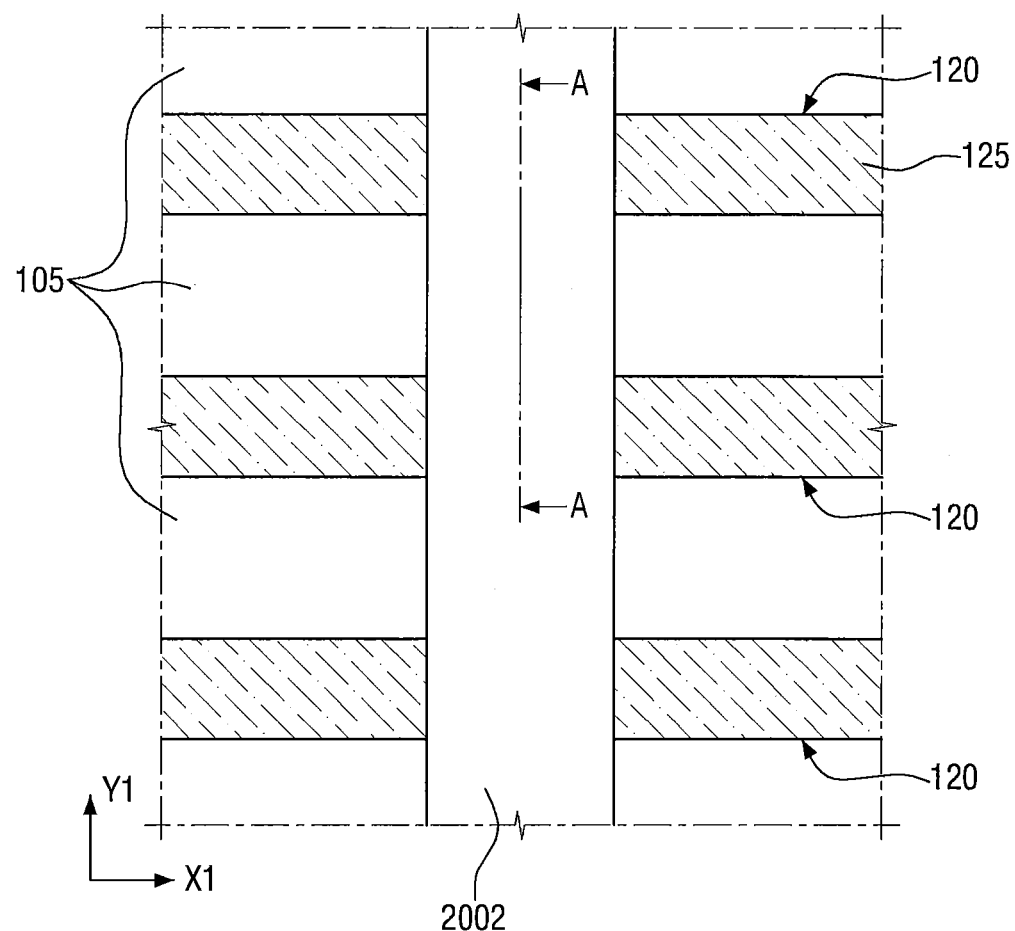
Figure 8B:
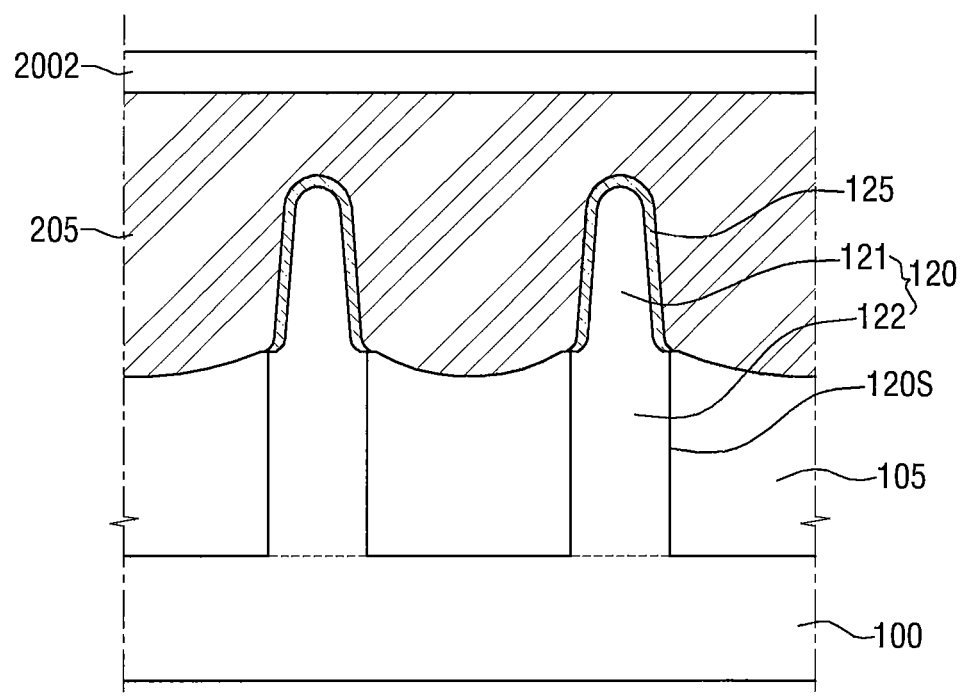

For reference, FIG. 1B is a cross-sectional view taken along a line A-A of FIG. 1A, and FIG. 3B is a cross-sectional view taken along a line A-A of FIG. 3A. FIG. 8B is a cross-sectional view taken along a line A-A of FIG. 8A, and FIG. 9B is a cross-sectional view taken along a line B-B of FIG. 9A. FIGS. 10Bb and 11B are cross-sectional views taken along a line B-B of FIGS. 10A and 11A, respectively. FIGS. 12Bb and 12Cc are cross-sectional views taken along a line A-A and a line B-B of FIG. 12A, respectively, and FIGS. 13B and 13C are cross-sectional views taken along a line A-A and a line B-B of FIG. 13A, respectively. FIGS. 14B and 14Cc are cross-sectional views taken along a line A-A and a line B-B of FIG. 14A, respectively.

Referring to FIGS. 1A and 1B, first mask patterns 2001 that extend in a first direction X1 are formed on a substrate 100.

The substrate 100 can be, for example, a silicon substrate, bulk silicon or a SOI (silicon-on-insulator). In other embodiments, the substrate 100 can include, for example, another semiconductor such as germanium, or may be a compound semiconductor such as a group IV-IV compound semiconductor or a group III-V compound semiconductor. The substrate 100 can also be an element in which an epilayer is formed on a base substrate.

Taking the group IV-IV compound semiconductor as an example, the substrate 100 may be a binary compound or a ternary compound containing at least two or more of carbon (C), silicon (Si), germanium (Ge), and tin (Sn), or a compound obtained by doping these compounds with a group IV element.

Taking the group III-V compound semiconductor as an example, the substrate 100 may be a binary compound, a ternary compound or a quaternary compound formed, by binding at least one of aluminum (Al), gallium (Ga), and indium (In) as a group III element with one of phosphorus (P), arsenic (As) and antimonium (Sb) as a group V element.

In the method for fabricating the semiconductor device according to the embodiment of the inventive concepts, the substrate 100 will be described to be a silicon substrate.

The first mask pattern 2001 may include, for example, silicon oxide, silicon nitride, silicon oxynitride, a metal film, a photoresist, SOG (Spin On Glass) or SOH (Spin On Hard mask), but is not limited to these materials.

Figure 2:
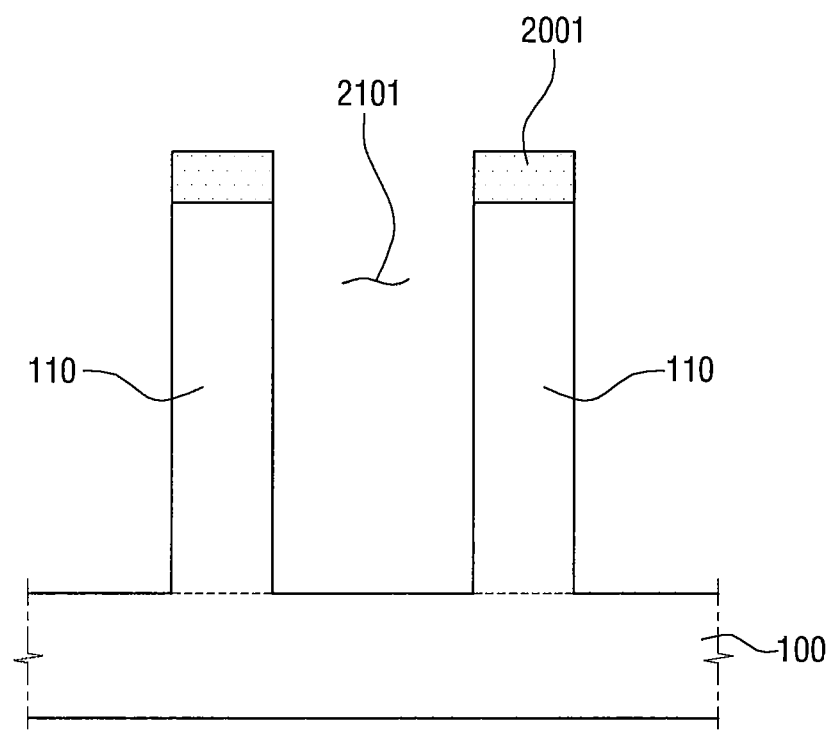

Referring to FIG. 2, a part of the substrate 100 may be etched using the first mask patterns 2001 as an etching mask. By etching portions of the substrate 100 that are not covered by the first mask patterns 2001 one or more first trenches 2101 may be formed in the substrate 100.

By etching the substrate 100 in the manner described above, first fin-shaped patterns 110 can be formed on the substrate 100. Since the first fin-shaped patterns 110 are formed using the first mask patterns 2001 as an etching mask, the first fin-shaped patterns 110 may extend in the first direction X1 like the first mask patterns 2001.

The first mask patterns 2001 may remain on the respective first fin-shaped patterns 110.

Referring to FIGS. 3A and 3B, a pre-field insulating film 105P is formed on the substrate to fill the first trenches 2101.

The pre-field insulating film 105P can include, for example, at least one of a silicon oxide film, a silicon nitride film and a silicon oxynitride film. The pre-field insulating film 105P can be formed by, for example, physical vapor deposition (PVD), chemical vapor deposition (CVD), atomic layer deposition (ALD) or a combination thereof.

Through a flattening process such as for example, a chemical-mechanical polishing process, the upper surface of the first fin-shaped pattern 110 and the upper surface of the pre-field insulating film 105P can be placed on the same plane. The first mask patterns 2001 can be removed by the flattening process, but embodiments of the inventive concepts are not limited thereto. For example, in other embodiments, the first mask patterns 2001 may be removed before forming the pre-field insulating film 105P or may be removed after a recess process is performed which is described below with reference to FIG. 4.

Figure 4:
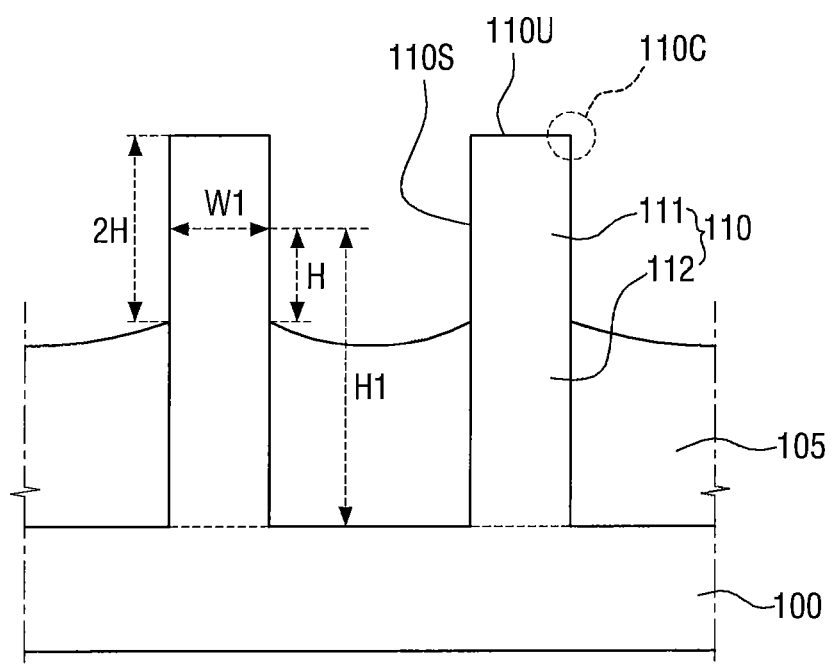

Referring to FIG. 4, upper portions of the first fin-shaped patterns 110 may be exposed by recessing the upper part of the pre-field insulating film 105P to form a field insulating film 105.

The recess process may be a selective etching process. By removing a portion of the pre-field insulating film 105P, the first fin-shaped patterns 110 may protrude upwardly from the upper surface of the field insulating film 105.

Each first fin-shaped pattern 110 can include a lower part 112 and an upper part 111 that is above the lower part 112. The lower part 112 of each first fin-shaped pattern may directly contact the field insulating film 105 and may be surrounded by the field insulating film 105. The upper part 111 of each first fin-shaped pattern may not directly contact the field insulating film 105. In other words, the portion of each first fin-shaped pattern 110 that protrudes upwardly from the upper surface of the field insulating film 105 comprises the upper part 111 of each first fin-shaped pattern 110.

It will also be appreciated that in other embodiments the upper parts 111 of the first fin-shaped patterns 110 may be formed by an epitaxial process as opposed to be a recess process. In such embodiments, after forming the pre-field insulating film 105P of FIGS. 3A and 3B, an epitaxial process is performed using the exposed upper surface of the first fin-shaped pattern 110 as a seed to form the upper parts 111 of the first fin-shaped patterns 110 that protrude upwardly from the upper surface of the pre-field insulating film 105P can be formed. In such embodiments, the pre-field insulating film 105P may have a planar upper surface.

The first fin-shaped patterns 110 may also be doped to adjust the threshold voltage of the transistors formed thereof. In a case where the semiconductor device is an NMOS fin-shaped transistor, the impurity ions that are doped into the first fin-shaped patterns 110 may be boron (B), and in a case of a PMOS fin-shaped transistor, the impurity ions that are doped into the first fin-shaped patterns may be phosphorus (P) or arsenic (As).

The doping for adjustment of the threshold voltage may be performed after exposing the upper part 111 of the first fin-shaped pattern 110.

A height of the upper part 111 of each first fin-shaped pattern 110 that protrudes above the upper surface of the field insulating film 105 can be 2H. A width of the first fin-shaped pattern 110 at a point that is half the height of the upper part 111 may be W1. In other words, at a height H1 above the lowermost part of the first fin-shaped pattern 110 or an upper surface of the substrate 100, the width of the first fin-shaped pattern 110 in the second direction Y1 in FIG. 3A may be a first width W1.

The first fin-shaped pattern 110 includes an upper surface 110U, a sidewall 110S, and a corner portion 110C at which the upper surface 110U and the sidewall 110S meet. In FIG. 4, the corner portion 110C of the first fin-shaped pattern may have an angular shape.

Figure 5:
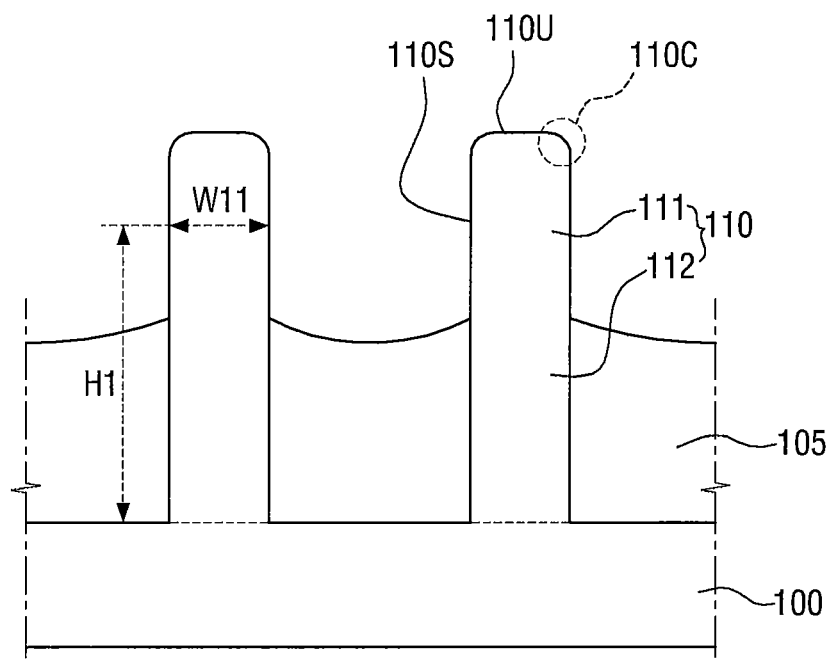

Referring to FIG. 5, the corner portion 110C of the first fin-shaped pattern may be rounded by etching the first fin-shaped pattern 110. That is, it is possible to etch the corner portion 110C of the first fin-shaped pattern to have a rounded shape.

At a height H1 above the lowermost part of the first fin-shaped pattern 110, a corrected first width of the first fin-shaped pattern 110 with the rounded corner portion can be W11.

In FIGS. 4 and 5, at the height H1 above the lowermost part of the first fin-shaped pattern 110, the width W1 of the first fin-shaped pattern 110 before the rounding of the corner portion has been illustrated as being substantially the same as the width W11 of the first fin-shaped pattern 110 after the rounding of the corner portion, but embodiments of the inventive concepts are not limited thereto.

That is, it is a matter of course that the upper part 111 of the first fin-shaped pattern can be partially etched while rounding the corner portion 110C of the first fin-shaped pattern. In such a case, the width W1 of the first fin-shaped pattern 110 before the rounding of the corner portion may be greater than the width W11 of the first fin-shaped pattern after the rounding of the corner portion 110.

In the discussion that follows, the width W1 of the first fin-shaped pattern 110 before the rounding is the same as the width W11 of the first fin-shaped pattern 110 after the rounding.

Figure 6:
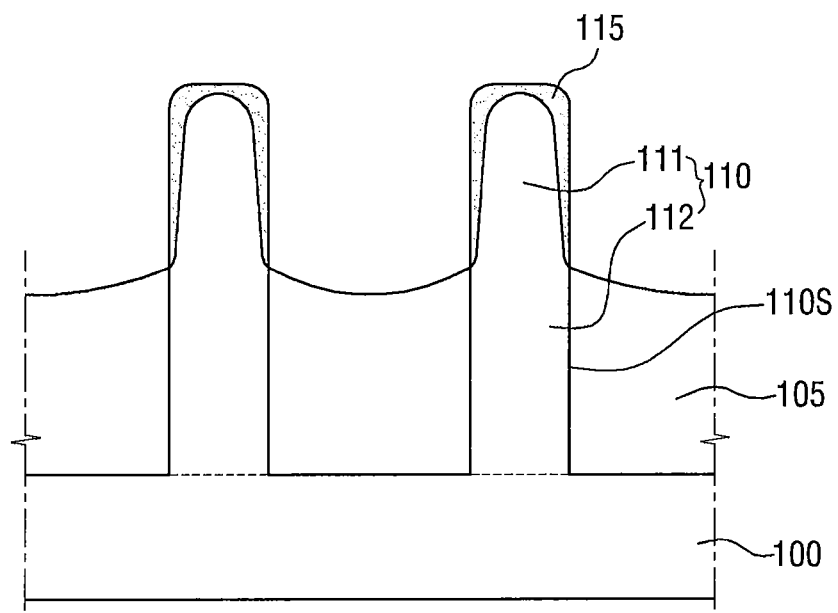

Referring to FIG. 6, a first oxide film 115 may be formed along the profile of the first fin-shaped pattern 110.

The first oxide film 115 may be formed along the profile of the upper part 111 of the first fin-shaped pattern that protrudes above the upper surface of the field insulating film 105. The first oxide film 115 may be formed along the profile of the upper part 111 of the first fin-shaped pattern including the rounded corner portion.

The first oxide film 115 may be formed by oxidizing the upper part 111 of the first fin-shaped pattern 110 that has the rounded corner portion.

The first oxide film 115 may be formed using for example, chemical oxidation, ultraviolet oxidation, dual plasma oxidation, thermal oxidation, chemical vapor deposition, atomic layer deposition or the like. When the first oxide film 115 is formed using the chemical vapor deposition, the atomic layer deposition or the like, a part of the first fin-shaped pattern 110 may be oxidized.

The first oxide film 115 may be formed to cure, for example, surface defects such as charge trap sites of the first fin-shaped pattern 110 that may be generated during the formation of the first fin-shaped pattern 110.

Figure 7:
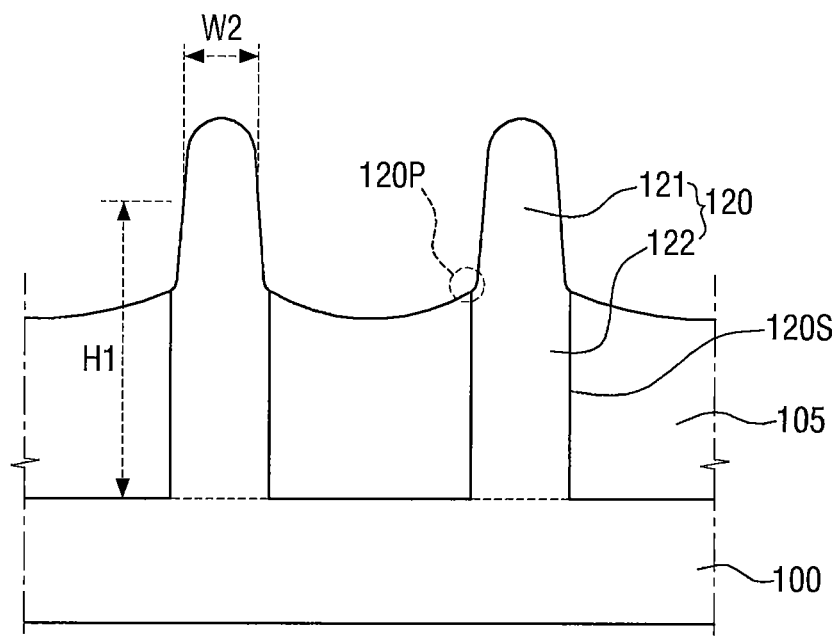

Referring to FIG. 7, a second fin-shaped pattern 120 that protrudes above the upper surface of the field insulating film 105 may be formed by removing the first oxide film 115.

The first oxide film 115 may be removed using an etching process or the like. The first oxide film 115 may be removed using, for example, a chemical oxide removal method (COR), Siconi or descum.

The second fin-shaped pattern 120 may include a lower part 122 and an upper part 121 that is above the lower part 122. The lower part 122 of the second fin-shaped pattern 120 may directly contact the field insulating film 105 and may be surrounded by the field insulating film 105. The upper part 121 of the second fin-shaped pattern 120 may not directly contact the field insulating film 105.

When not considering the removal of a portion of the field insulating film 105 during removal of the first oxide film 115, the lower part 122 of the second fin-shaped pattern 120 may be substantially the same as the lower part 112 of the first fin-shaped pattern 110.

At a height H1 above the lowermost part of the second fin-shaped pattern 120, the width of the second fin-shaped pattern 120 may be a second width W2. The width W2 of the second fin-shaped pattern 120 may be narrower than the width W1 of the first fin-shaped pattern 110 before the rounding and the width W11 of the first fin-shaped pattern 110 after the rounding.

In other words, the width W2 of the upper part 121 of the second fin-shaped pattern 120 may be narrower than the width W1 of the upper part 111 of the first fin-shaped pattern 110 before the rounding and the width W11 of the upper part 111 of the first fin-shaped pattern 110 after the rounding.

With reference to FIGS. 6 and 7, second fin-shaped pattern 120 may be formed by removing a portion of the upper part 111 of the first fin-shaped pattern.

In other words, during the forming and removing of the first oxide film 115, the profile of the sidewall 110S of the first fin-shaped pattern 110 changes. Therefore, the second fin-shaped pattern 120 can be formed by modifying the profile of the sidewall 110S of the first fin-shaped pattern including the rounded corner portion.

The sidewall 120S of the second fin-shaped pattern may include a first inflection point 120P.

Referring to FIGS. 8A and 8B, a second oxide film 125 may be formed along the profile of the upper part 121 of the second fin-shaped pattern 120 that protrudes above the upper surface of the field insulating film 105.

The second oxide film 125 may be formed by oxidizing a portion of the second fin-shaped pattern 120. For example, the second oxide film 125 may be formed by oxidizing a portion of the upper part 121 of the second fin-shaped pattern 120.

The second oxide film 125 may be formed using, for example, chemical oxidation, ultraviolet oxidation, dual plasma oxidation, thermal oxidation, chemical vapor deposition or an atomic layer deposition.

Subsequently, a first dummy gate electrode 205 may be formed. In particular, a dummy gate electrode layer may be formed, and a mask pattern 2002 may be formed on the first dummy gate electrode layer. The first dummy gate electrode layer may then be etched using the mask 2002 as an etching mask to form the first dummy gate electrode 205. The first dummy gate electrode 205 may extend in the second direction Y1 to intersect the second fin-shaped pattern 120.

The first dummy gate electrode 205 is formed on the second fin-shaped pattern 120 and on the second oxide film 125 that is formed along the profile of the upper part 121 of the second fin-shaped pattern 120.

The first dummy gate electrode 205 may include, for example, polysilicon, amorphous silicon or the like. The second mask pattern 2002 may include, for example, silicon oxide, silicon nitride, silicon oxynitride or the like.

In FIGS. 8A and 8B, the second oxide film 125 is illustrated as being exposed on both sides of the first dummy gate electrode 205, but embodiments of the inventive concepts are not limited thereto. For example, in other embodiments, during the etching process that is used to form the first dummy gate electrode 205, the second oxide film 125 which does not vertically overlap the first dummy gate electrode 205 may be removed. Herein, a first structure that is formed on an underlying substrate "vertically overlaps" a second structure that is formed on the substrate if a line that is perpendicular to a plane defined by the top surface of the substrate bisects both the first and second structures.

In the method for fabricating the semiconductor device according to the embodiment of the inventive concepts, the first dummy gate electrode 205 is described as being a replacement gate electrode, but it is not limited thereto.

In other words, it is a matter of course that the gate electrode can be formed using a material which will be used as a gate electrode of the transistor rather than a dummy gate electrode. It will also be understood that a high dielectric constant gate insulating film can be formed between the second oxide film 125 and the gate electrode.

Figure 9A:
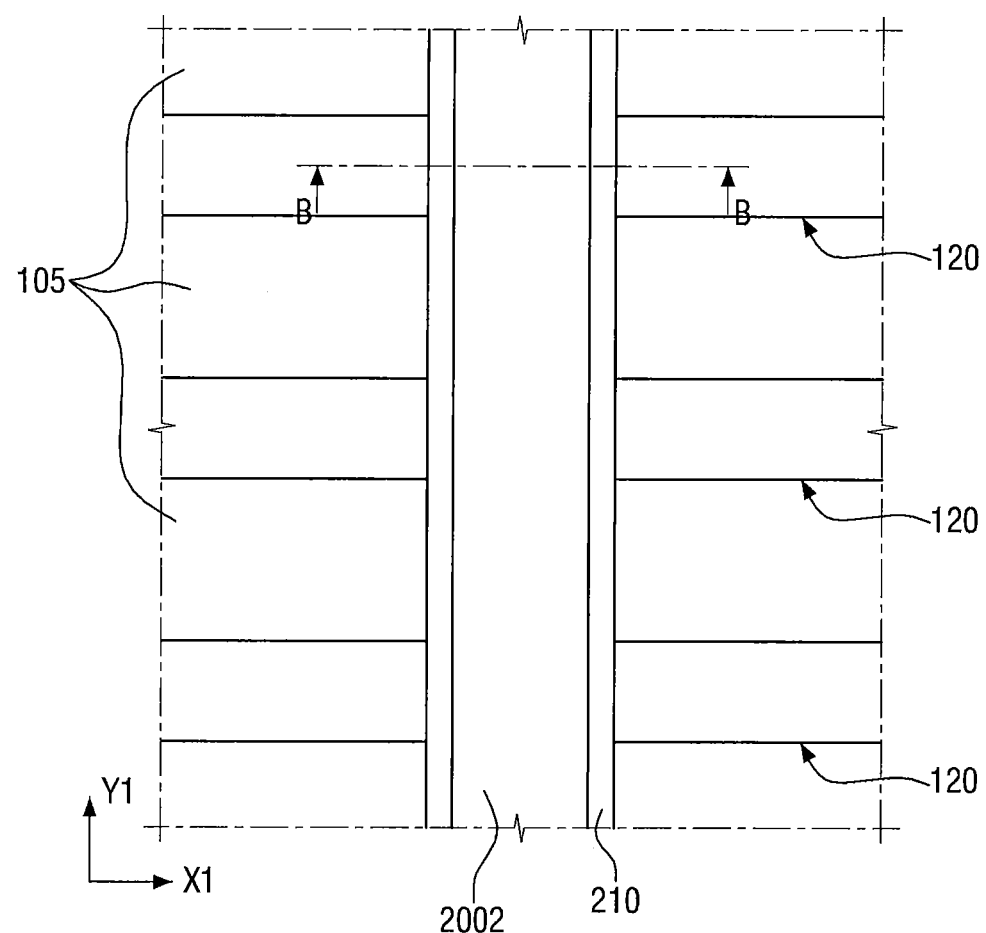
Figure 9B:
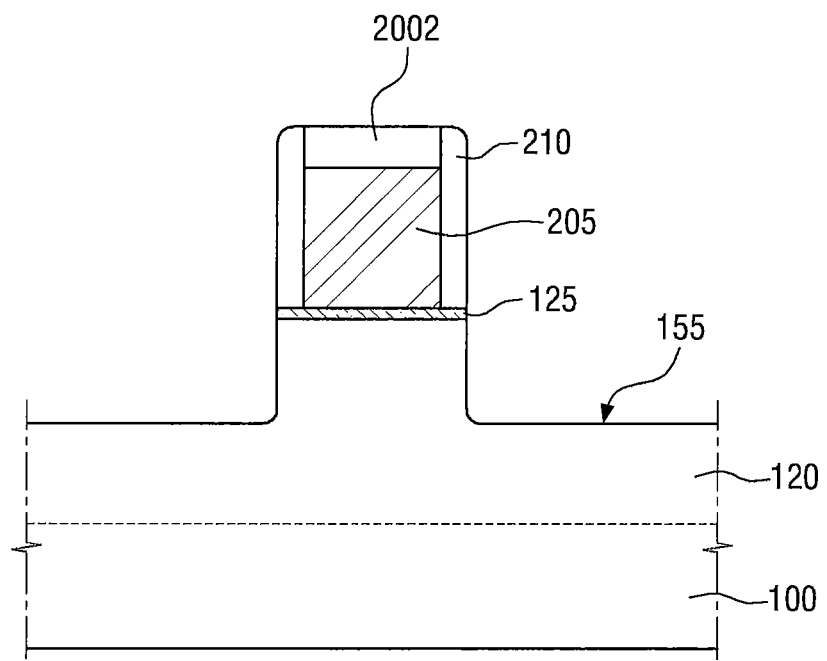

Referring to FIGS. 9A and 9B, a first gate spacer 210 may be formed on the sidewalls of the first dummy gate electrode 205.

After forming an insulating film which covers the first dummy gate electrode 205 and the second fin-shaped pattern 120, the first gate spacer 210 can be formed by etching the insulating film. The first gate spacer 210 may include, for example, at least one of silicon nitride (SiN), silicon oxynitride (SiON), silicon oxide ($SiO_2$), silicon oxycarbonitride (SiOCN) or a combination thereof.

Subsequently, a recess 155 may be formed in the second fin-shaped pattern 120 by removing a portion of the second fin-shaped pattern 120 that are exposed on both sides of the first dummy gate electrode 205. The upper surface of the second fin-shaped pattern 120 that is exposed by the field insulating film 105 can be disposed on the same plane as the upper surface of the field insulating film 105, but embodiments of the inventive concepts are not limited thereto.

Figure 10A:
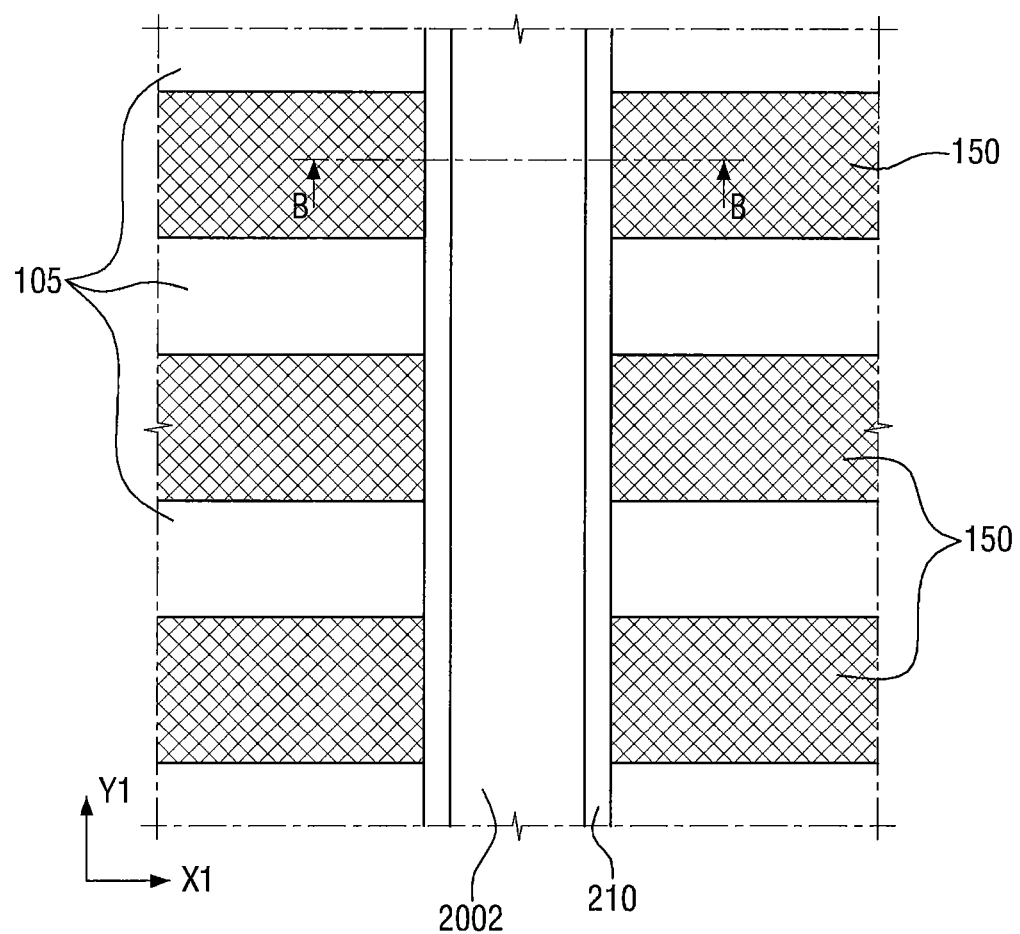
Figure 10B:
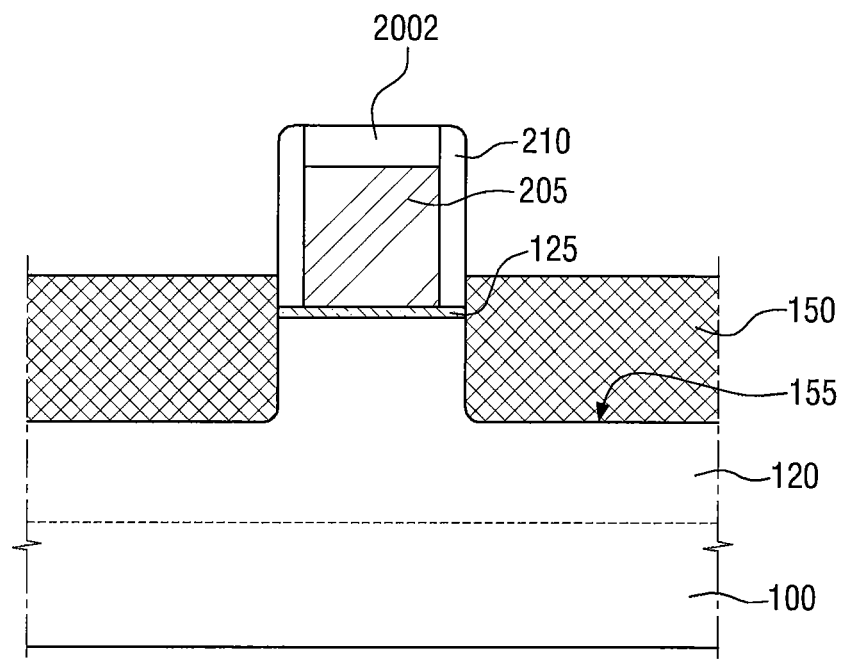

Referring to FIGS. 10A and 10B, source/drains 150 may be formed on the second fin-shaped pattern 120 on each side of the first dummy gate electrode 205.

The source/drains 150 may be formed by filling the recess 155. The source/drains 150 may be formed by an epitaxial process. The source/drains 150 may be, for example, elevated source/drains.

When the semiconductor device is a PMOS transistor, the source/drains 150 may include a compressive stress material. For example, the compressive stress material may be a material having a lattice constant greater than Si, and may be, for example, SiGe. The compressive stress material may improve the mobility of carriers in the channel region by applying compressive stress to the second fin-shaped pattern 120 (consequently, the third fin-shaped pattern 130).

Alternatively, when the semiconductor device is an NMOS transistor, the source/drains 150 may include a tensile stress material. For example, when the second fin-shaped pattern 120 is silicon, the source/drains 150 may be a material (e.g., SiC) having a lattice constant smaller than silicon. For example, the tensile stress material may improve the mobility of carriers in the channel region by applying tensile stress to the second fin-shaped pattern 120 (consequently, the third fin-shaped pattern 130).

In FIG. 10A, although the sources/drains 150 adjacent to each other in the second direction Y1 are illustrated as being spaced apart from each other rather than being in contact with each other, this is merely for convenience of explanation, and embodiments of the invention are not limited thereto. It is a matter of course that the sources/drains 150 that are adjacent to each other in the second direction Y1 may be in contact with each other.

Figure 11A:
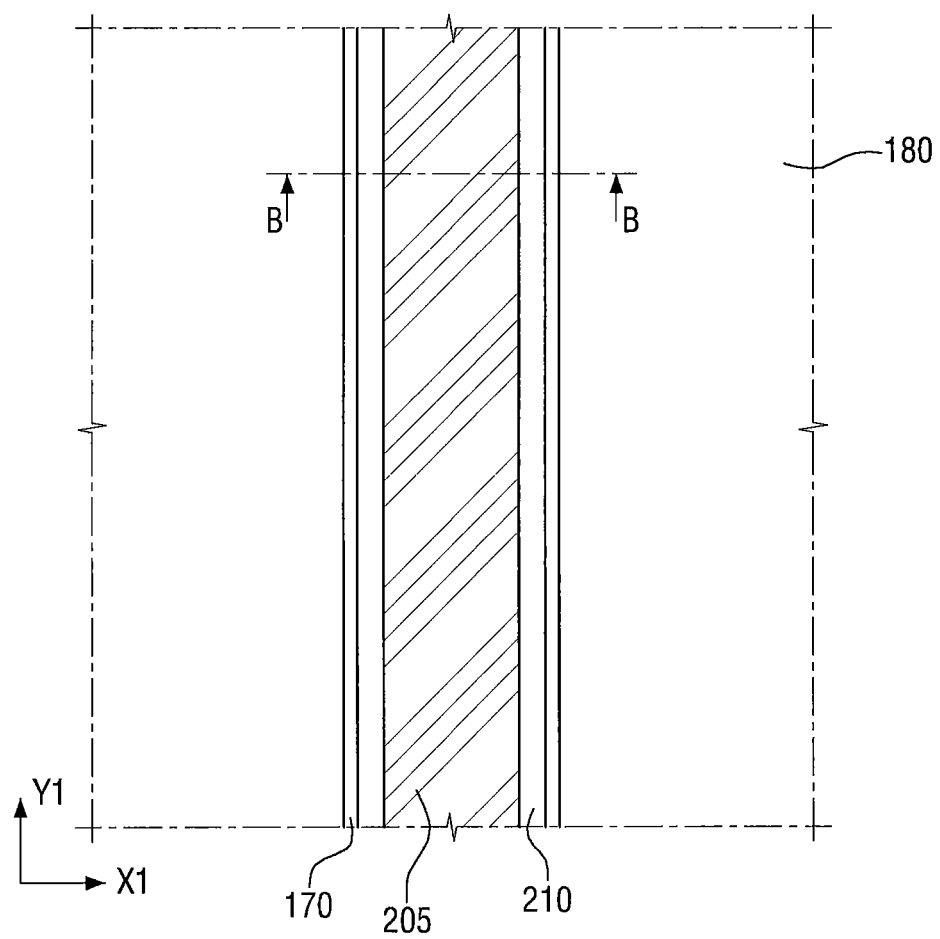
Figure 11B:
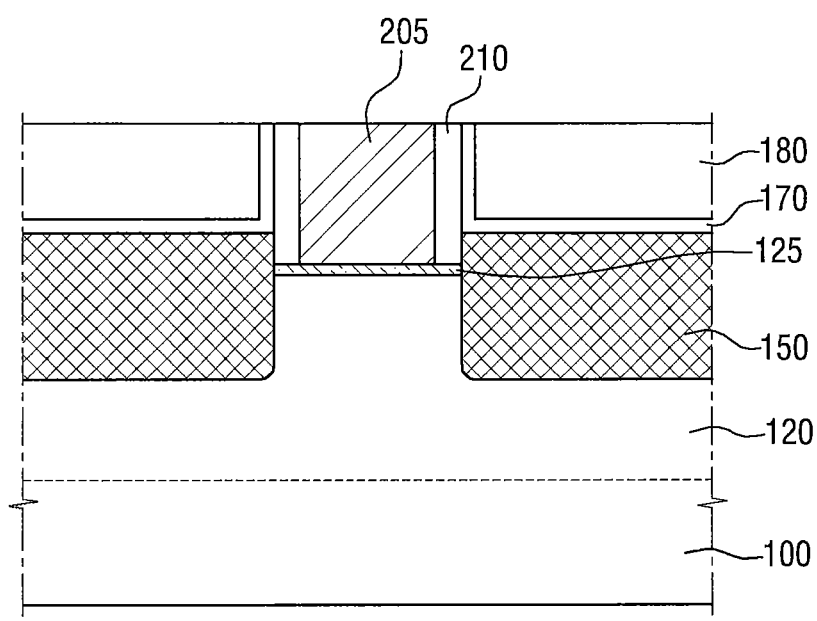

Referring to FIGS. 11A and 11B, an etch stop film 170 is formed that covers the source/drains 150 and the first dummy gate electrode 205. An interlayer insulating film 180 which covers the source/drains 150 and the first dummy gate electrode 205 may be formed on the etch stop film 170.

Subsequently, a planarization operation may be performed on the interlayer insulating film 180 until the upper surface of the first dummy gate electrode 205 is exposed. The second mask pattern 2002 may be removed through this planarization operation.

The etch stop film 170 may include, for example, at least one of silicon nitride (SiN), silicon oxynitride (SiON), silicon oxide ($SiO_2$), silicon oxycarbonitride (SiOCN), silicon carbonitride (SiCN) or a combination thereof.

The etch stop film 170 may be formed by, for example, physical vapor deposition (PVD), chemical vapor deposition (CVD), atomic layer deposition (ALD) and/or a combination thereof.

The interlayer insulating film 180 may include, for example, one of silicon oxide, silicon nitride, silicon oxynitride, TEOS (Tetra Ethyl Ortho Silicate), FOX (Flowable Oxide), TOSZ (Tonen SilaZen), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate) or a low dielectric constant material. The low dielectric constant material may include, for example, FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material or the like.

The interlayer insulating film 180 can be formed by, for example, physical vapor deposition (PVD), chemical vapor deposition (CVD), atomic layer deposition (ALD), a coating or a combination thereof.

Figure 12A:
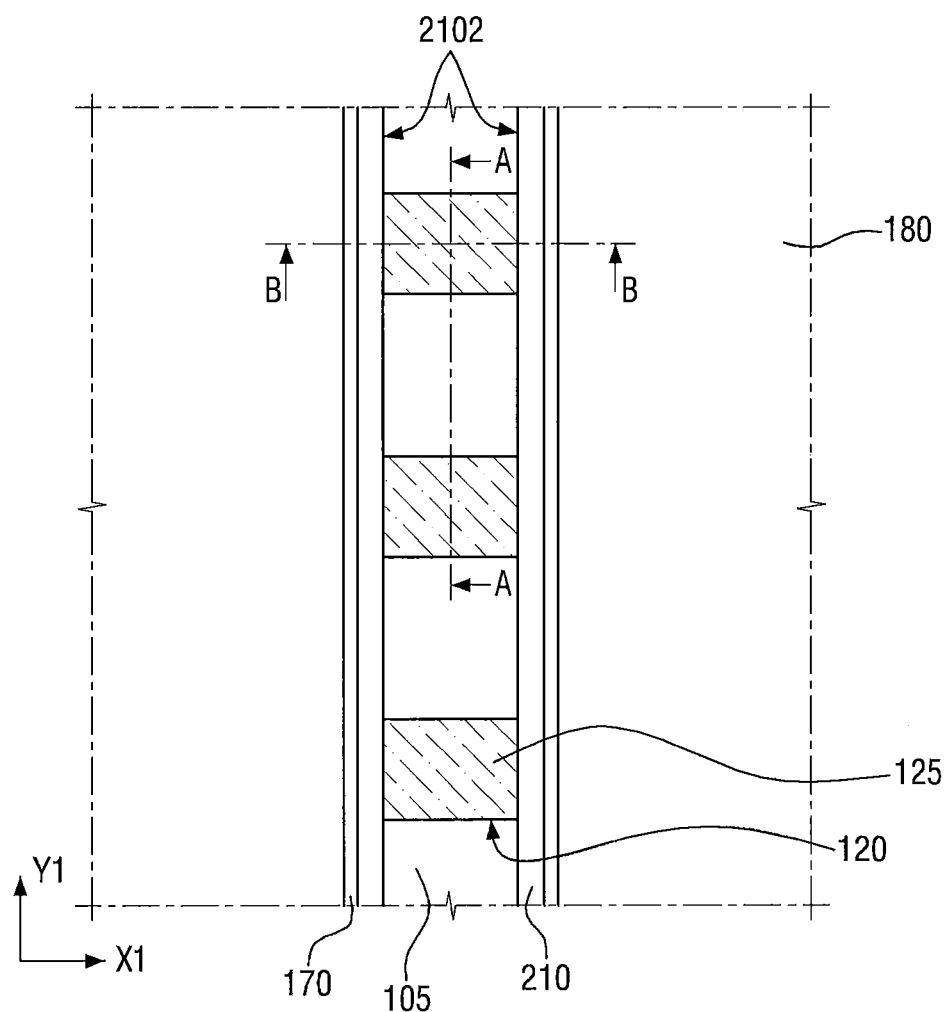
Figure 12B:
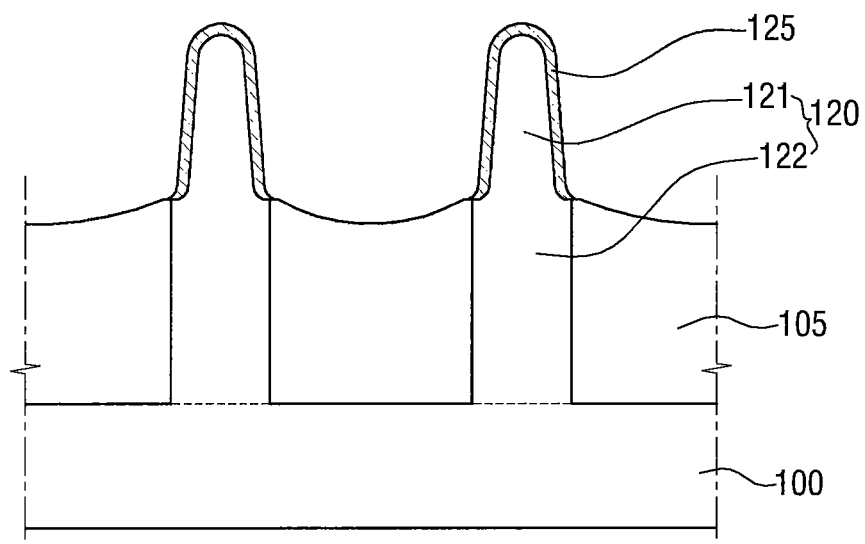
Figure 12C:
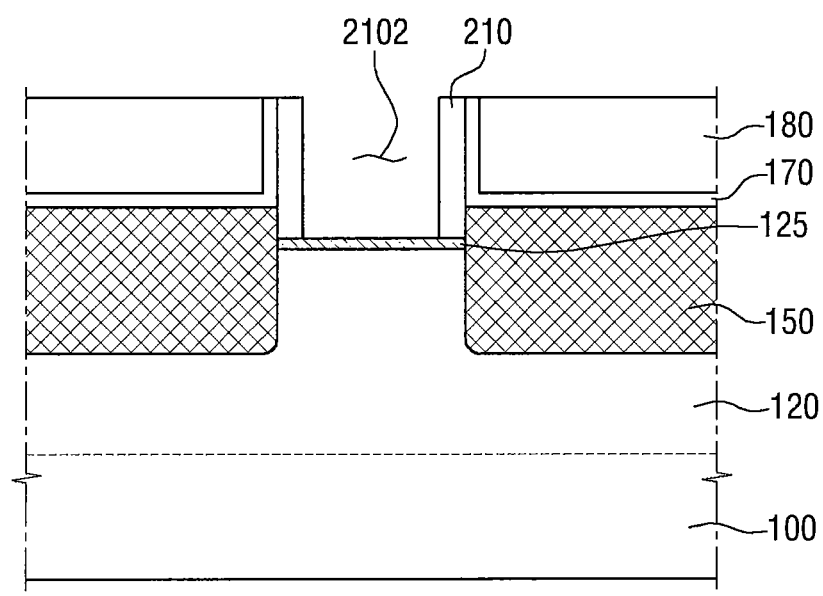

Referring to FIGS. 12A to 12C, a second trench 2102 extending in the second direction Y1 may be formed by removing the first dummy gate electrode 205.

Side surfaces of the second trench 2102 may be defined by the sidewalls of the first gate spacer 210.

As the second trench 2102 is formed, the field insulating film 105 is exposed, and the second oxide film 125 formed along the profile of the upper part 121 of the second fin-shaped pattern may be exposed.

Figure 13A:
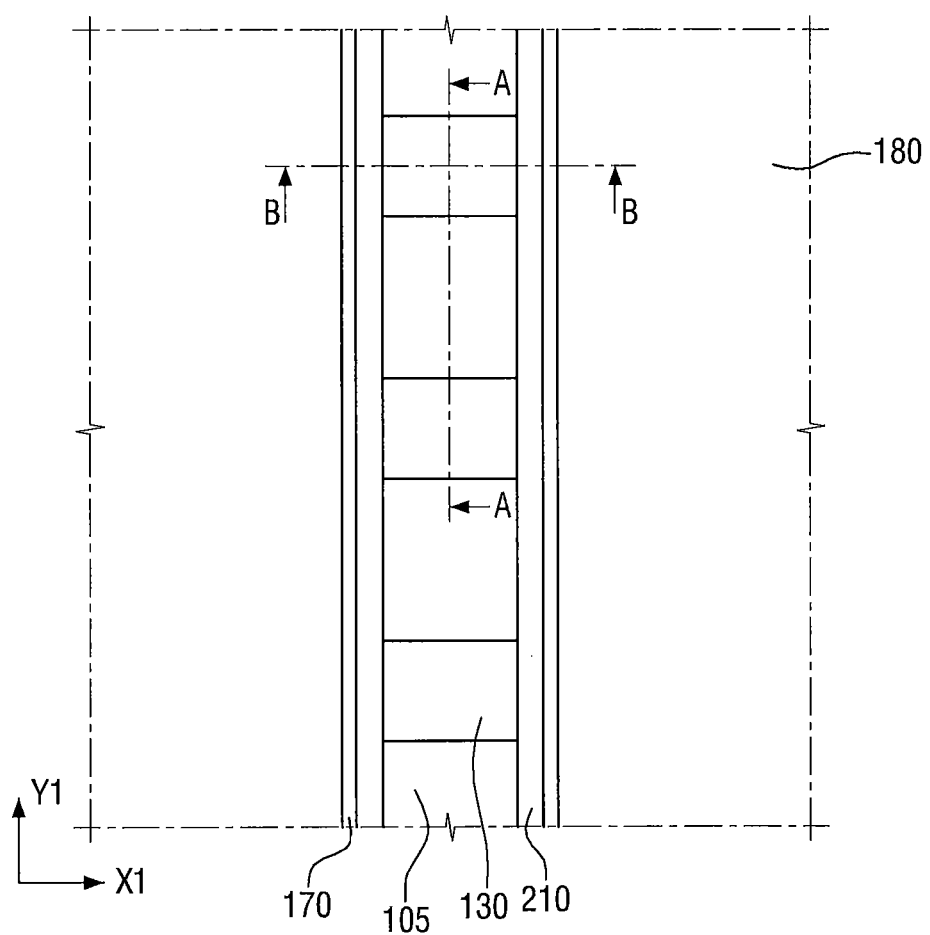
Figure 13B:
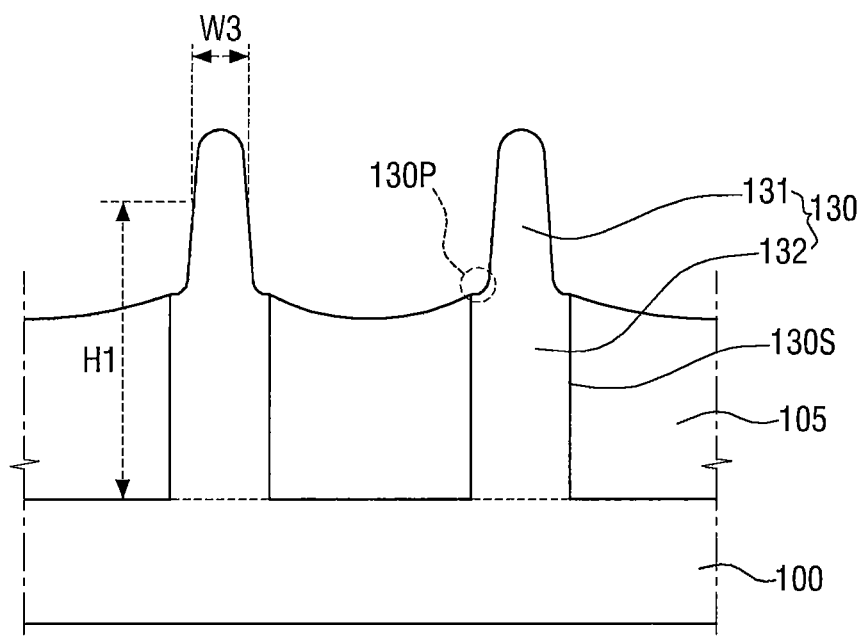
Figure 13C:
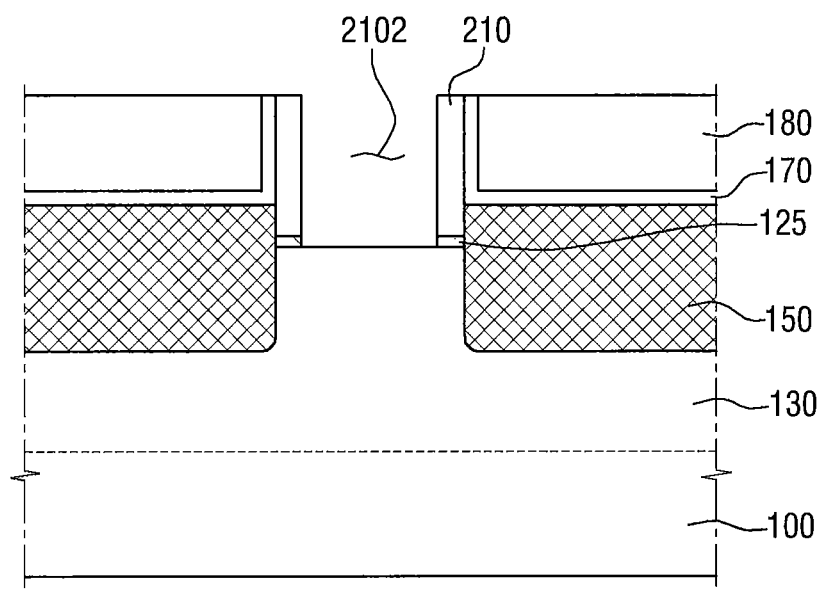
Figure 14B:
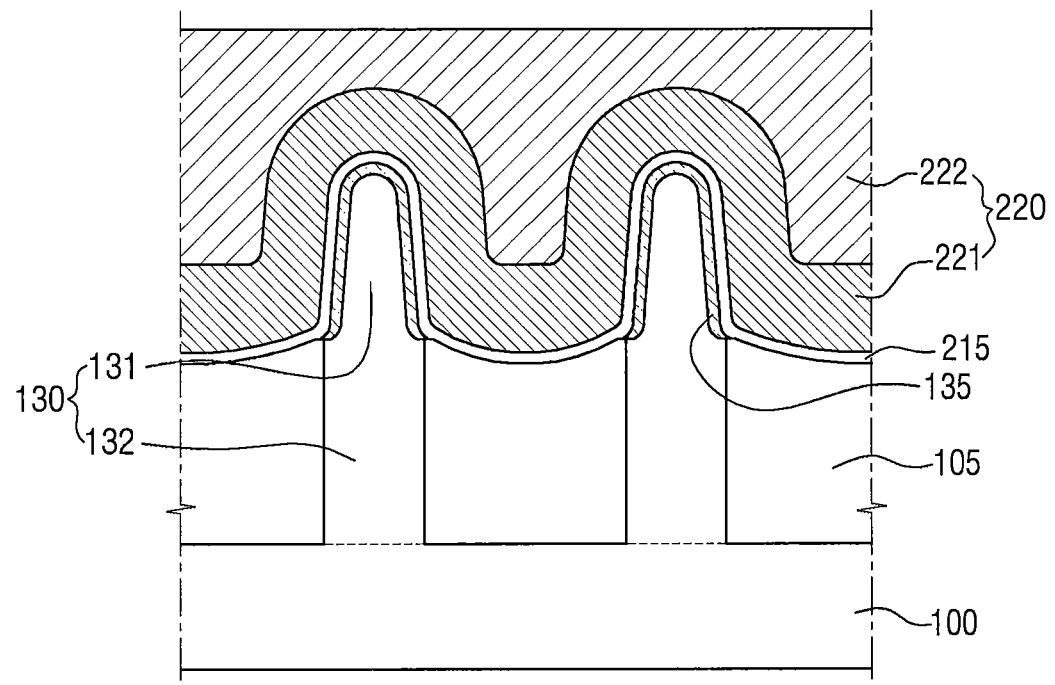
Figure 14C:
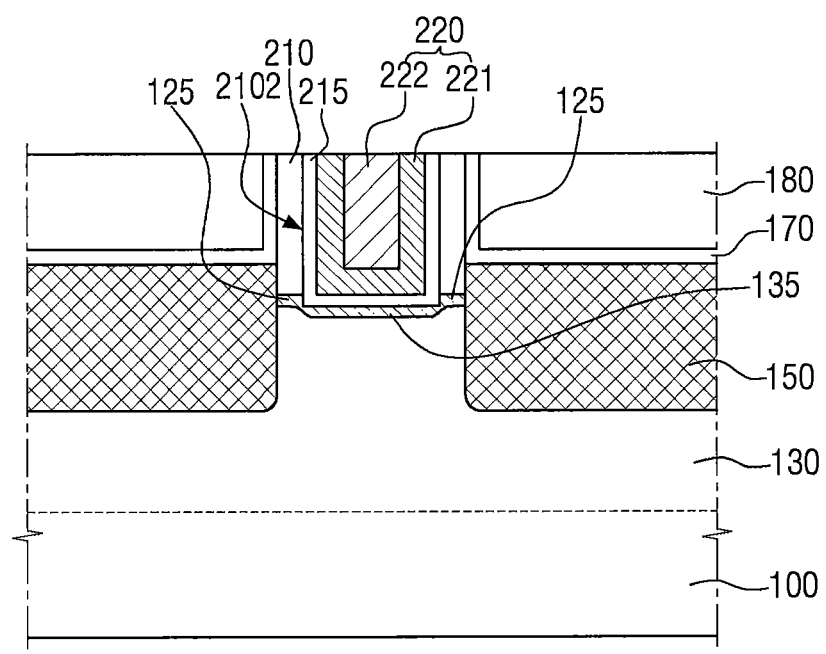

Referring to FIGS. 13A to 13C, a third fin-shaped pattern 130 that protrudes above the upper surface of the field insulating film 105 is formed by removing the second oxide film 125.

Specifically, the third fin-shaped pattern 130 is formed by removing a portion of the second oxide film 125 that is exposed by the second trench 2102. The remainder of the second oxide film 125 that is underneath the first gate spacer 210 may remain. That is, the third fin-shaped pattern 130 can include the remainder of the second oxide film 125 that is underneath the first gate spacer 210.

The second oxide film 125 can be removed using, for example, an etching process or the like. The second oxide film 125 can be removed, for example, using a chemical oxide removal method (COR), Siconi or descum, but the removal techniques are not limited thereto.

The third fin-shaped pattern 130 may include a lower part 132 and an upper part 131 that is above the lower part 132. The lower part 132 of the third fin-shaped pattern 130 may directly contact the field insulating film 105 and may be surrounded by the field insulating film 105. The upper part 131 of the third fin-shaped pattern may not directly contact the field insulating film 105.

When not considering the disappearance of the field insulating film 105 during removal of the second oxide film 125, the lower part 132 of the third fin-shaped pattern 130 can be substantially the same as the lower part 122 of the second fin-shaped pattern 120.

A width of the third fin-shaped pattern 130 at a distance H1 above the lowermost part of the third fin-shaped pattern 130 may be a third width W3. The width W3 of the third fin-shaped pattern 130 may be narrower, than the width W2 of the second fin-shaped pattern 120 and may be narrower than the width W1 of the first fin-shaped pattern 110 before the rounding and the width W11 of the first fin-shaped pattern 110 after the rounding.

In other words, the width W3 of the upper part 131 of the third fin-shaped pattern 130 may be narrower than the width W1 of the upper part 111 of the first fin-shaped pattern 110 before rounding, the width W11 of the upper part 111 of the first fin-shaped pattern 110 after rounding, and the width W2 of the upper part 121 of the second fin-shaped pattern 120.

With reference to FIGS. 8A, 8B and 13A to 13C, the third fin-shaped pattern 130 may be formed by removing a portion of the upper part 121 of the second fin-shaped pattern 120.

In other words, in the course of forming and removing the second oxide film 125, the profile of the sidewall 120S of the second fin-shaped pattern 120 changes. Therefore, the third fin-shaped pattern 130 may be formed by modifying the profile of the sidewall 120S of the second fin-shaped pattern 120. The third fin-shaped pattern 130 may be formed by modifying the profile of the sidewall 120S of the second fin-shaped pattern that vertically overlaps the first dummy gate electrode 205.

The sidewall 130S of the third fin-shaped pattern 130 may include a second inflection point 130P.

Referring to FIGS. 14A to 14C, a third oxide film 135 may be formed along the profile of the third fin-shaped pattern 130 that is exposed by the second trench 2102. The third oxide film 135 may be formed along the profile of the upper part 131 of the third fin-shaped pattern that protrudes above the upper surface of the field insulating film 105.

The third oxide film 135 may be formed by oxidizing an exposed part of the third fin-shaped pattern 130. For example, the third oxide film 135 may be formed by oxidizing a portion of the upper part 131 of the third fin-shaped pattern 130.

The third oxide film 135 can be formed by, for example, chemical oxidation, UV oxidation, dual plasma oxidation, thermal oxidation, chemical vapor deposition, atomic layer deposition or the like.

Subsequently, a first high dielectric constant insulating film 215 may be formed along the sidewall and the bottom surface of the second trench 2102. The first high dielectric constant insulating film 215 may be formed along the profiles of the field insulating film 105 and the portion of the third fin-shaped pattern 130 that protrudes above the field insulating film 105. The first high dielectric constant insulating film 215 may be formed on the third oxide film 135.

The first high dielectric constant insulating film 215 may comprise, for example, one or more of silicon oxynitride, silicon nitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

The first high dielectric constant insulating film 215 may be formed by, for example, physical vapor deposition (PVD), chemical vapor deposition (CVD), atomic layer deposition (ALD) or a combination thereof.

A first gate electrode 220 may be formed by filling the second trench 2102 with a conductive material. The first gate electrode 220 may extend in the second direction Y1 to intersect the third fin-shaped pattern 130. The first gate electrode 220 may be formed on the third fin-shaped pattern 130 with the first high dielectric constant insulating film 215 therebetween.

The first gate electrode 220 may include metal layers 221, 222. As illustrated, the first gate electrode 220 may be formed by lamination of the two or more metal layers 221, 222. The first metal layer 221 may serve to adjust a work function, and the second metal layer 222 may serve to fill a space formed by the first metal layer 221.

The first metal layer 221 may comprise, for example, at least one of TiN, WN, TiAl, TiAlN, TaN, TiC, TaC, TaCN, TaSiN or a combination thereof. The second metal layer 222 may comprise, for example, at least one of W, Al, Cu, Co, Ti, Ta, poly-Si, SiGe or a metal alloy.

FIGS. 15 to 17B are intermediate-stage diagrams that illustrate a method for fabricating a semiconductor device according to another embodiment of the inventive concepts. For convenience of description, the following discussion will primary focus on differences between the embodiment of FIGS. 1 to 14C and the embodiment of FIGS. 15 to 17B.

Figure 15:
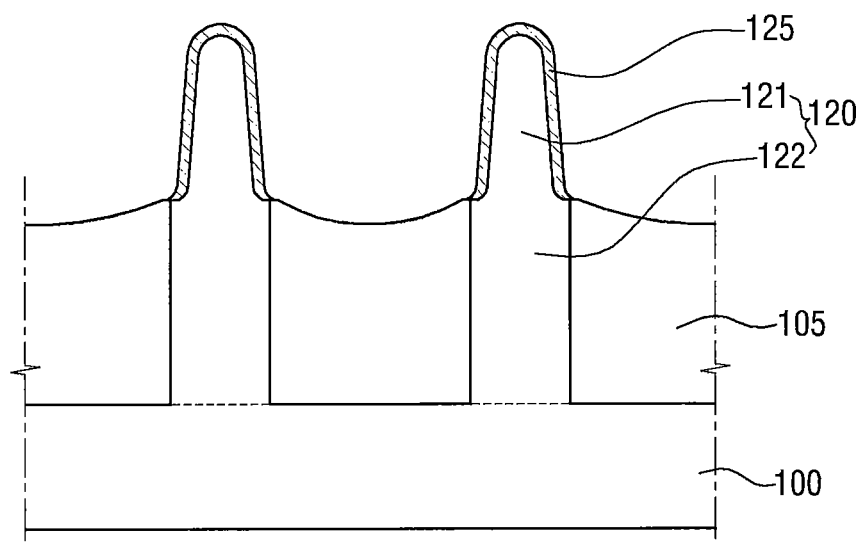
FIGS. 15 to 17B are intermediate-stage diagrams illustrating a method for fabricating a semiconductor device according to another embodiment of the inventive concepts.
Figure 17A:
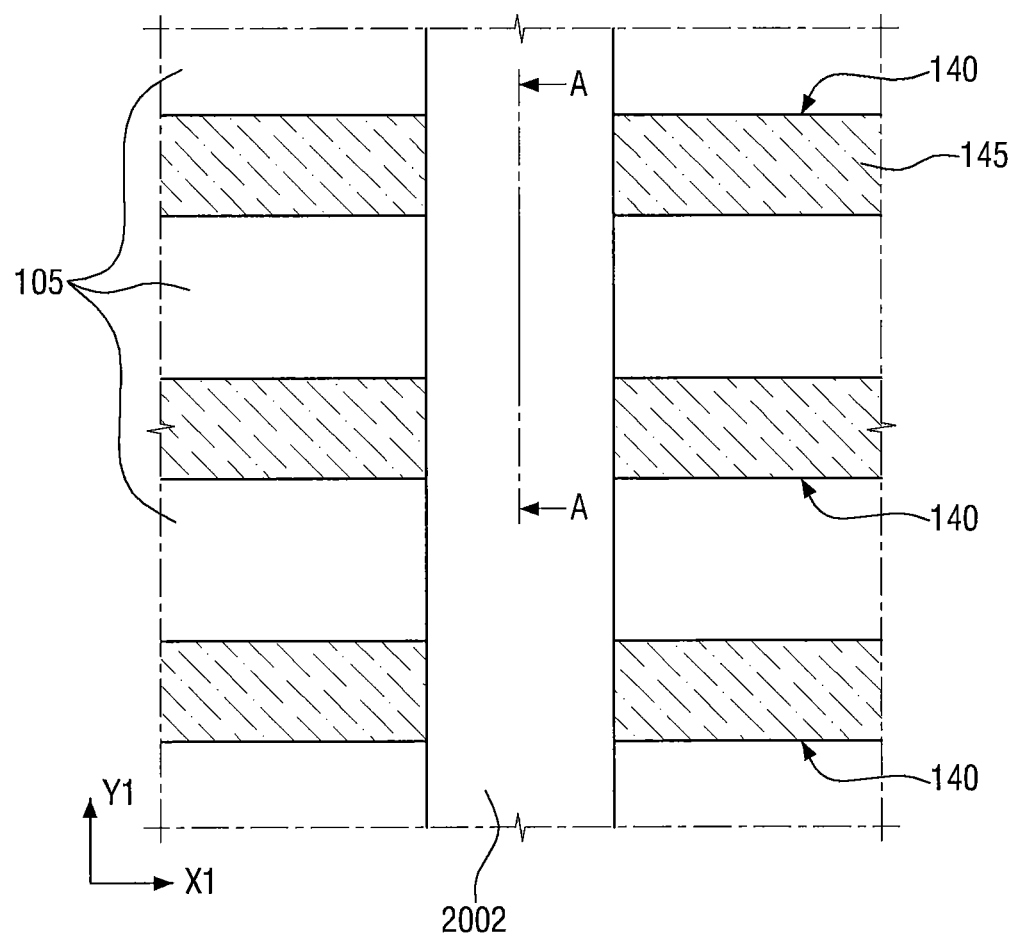
Figure 17B:
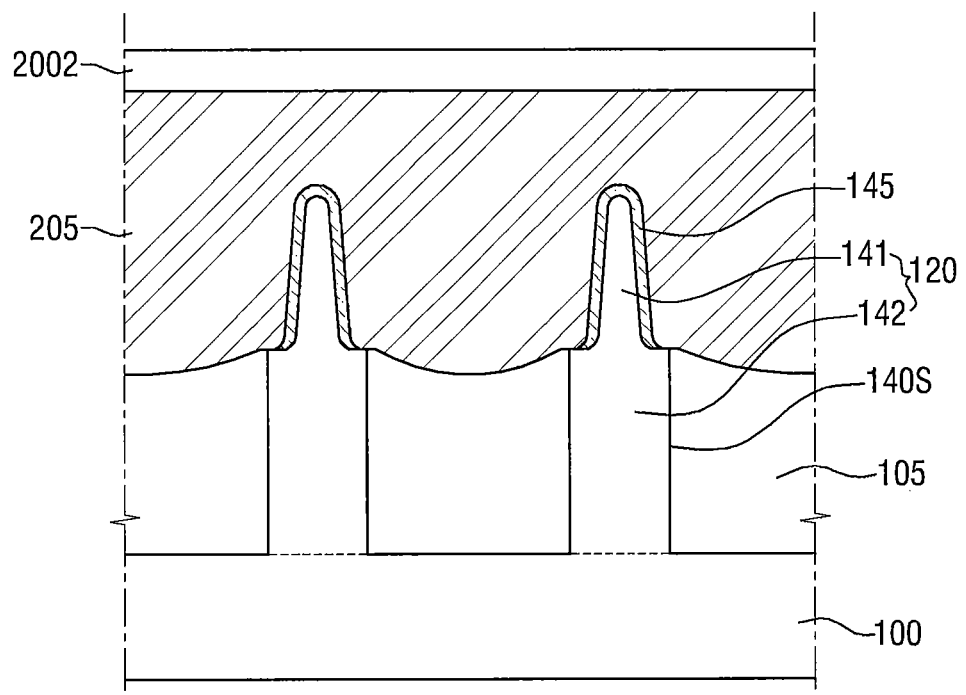

For reference, FIG. 17B is a cross-sectional view taken along a line A-A of FIG. 17A. FIG. 15 illustrates a process that may be performed after the processes of FIGS. 1-7.

Referring to FIG. 15, the second oxide film 125 may be formed along the profile of the exposed portion of the second fin-shaped pattern 120. The second oxide film 125 may be formed by oxidizing the exposed part of the second fin-shaped pattern 120.

The second oxide film 125 may be formed along the profile of the upper part 121 of the second fin-shaped pattern 120 that protrudes above the upper surface of the field insulating film 105.

The second oxide film 125 may be formed by, for example, chemical oxidation, UV oxidation, dual plasma oxidation, thermal oxidation, chemical vapor deposition or atomic layer deposition.

Figure 16:
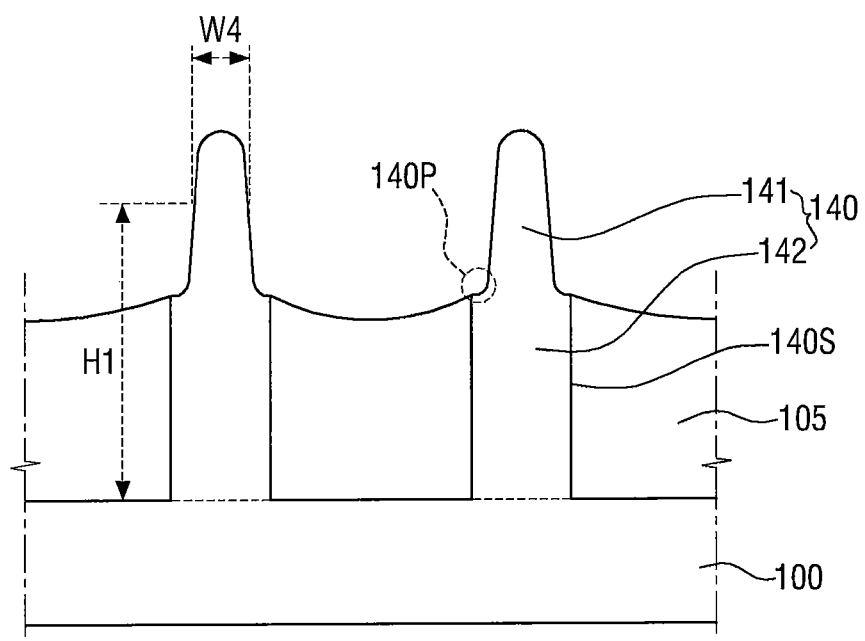

Referring to FIG. 16, the second oxide film 125 may be removed to form a fourth fin-shaped pattern 140 which protrudes above the upper surface of the field insulating film 105.

The second oxide film 125 may be removed using an etching process or the like. The second oxide film 125 may be removed using, for example, a chemical oxide removal (COR), Siconi or descum.

The fourth fin-shaped pattern 140 may include a lower part 142 and an upper part 141 that is above the lower part 142. The lower part 142 of the fourth fin-shaped pattern may directly contact the field insulating film 105 and may be surrounded by the field insulating film 105. The upper part 141 of the fourth fin-shaped pattern may not directly contact the field insulating film 105.

A width of the fourth fin-shaped pattern 140 at a height H1 above the lowermost part of the fourth fin-shaped pattern 140 may be a fourth width W4. The width W4 of the fourth fin-shaped pattern 140 may be narrower than the width W2 of the second fin-shaped pattern 120 and the width W11 of the first fin-shaped pattern 110 after rounding.

In other words, the width W4 of the upper part 141 of the fourth fin-shaped pattern 140 may be narrower than the width W2 of the second fin-shaped pattern 120 and the width W11 of the first fin-shaped pattern 110 after rounding.

With reference to FIGS. 15 and 16, the fourth fin-shaped pattern 140 may be formed by removing a portion of the upper part 121 of the second fin-shaped pattern 120.

In other words, in the course of forming and removing the second oxide film 125, the profile of the sidewall 120S of the second fin-shaped pattern 120 changes. Therefore, the fourth fin-shaped pattern 140 can be formed by modifying the profile of the sidewall 120S of the second fin-shaped pattern 120.

The sidewall of the fourth fin-shaped pattern 140S may include a third inflection point 140P.

Referring to FIGS. 17A and 17B, a fourth oxide film 145 may be formed along the profile of the fourth fin-shaped pattern 140. The fourth oxide film 145 may be formed along the profile of the upper part 141 of the fourth fin-shaped pattern 140 that protrudes above the upper surface of the field insulating film 105.

The fourth oxide film 145 may be formed by oxidizing a portion of the upper part 141 of the fourth fin-shaped pattern 140.

The fourth oxide film 145 may be formed by, for example, chemical oxidation, UV oxidation, dual plasma oxidation, thermal oxidation, chemical vapor deposition, atomic layer deposition or the like.

Subsequently, a first dummy gate electrode 205 may be formed. In particular, a dummy gate electrode layer may be formed, and a mask pattern 2002 may be formed on the first dummy gate electrode layer. The first dummy gate electrode layer may then be etched using the mask 2002 as an etching mask to form the first dummy gate electrode 205. The first dummy gate electrode 205 may extend in the second direction Y1 to intersect the fourth fin-shaped pattern 140.

The first dummy gate electrode 205 is formed on the fourth fin-shaped pattern 140. The first dummy gate electrode 205 may be formed on the fourth oxide film 145 which is formed along the profile of the upper part 141 of the fourth fin-shaped pattern 140.

In FIGS. 17A and 17B, the fourth oxide film 145 is illustrated as being exposed on both sides of the first dummy gate electrode 205, but embodiments of the inventive concepts are not limited thereto. For example, in other embodiments, during the etching process for forming the first dummy gate electrode 205, portions of the fourth oxide film 145 that do not vertically overlap the first dummy gate electrode 205 may be removed.

Subsequently, the first gate electrode 220 can be formed through the processes described above with reference to FIGS. 9A to 14C. During these processes, the third fin-shaped pattern 130 can be formed by removing the fourth oxide film 145 which is formed along the profile of the fourth fin-shaped pattern 140.

FIGS. 18 to 30 are intermediate-stage diagrams that illustrate a method for fabricating a semiconductor device according to still another embodiment of the inventive concepts. For convenience of description, the following discussion will mainly focus on differences from embodiment described above with reference to FIGS. 1 to 14C.

Figure 18:
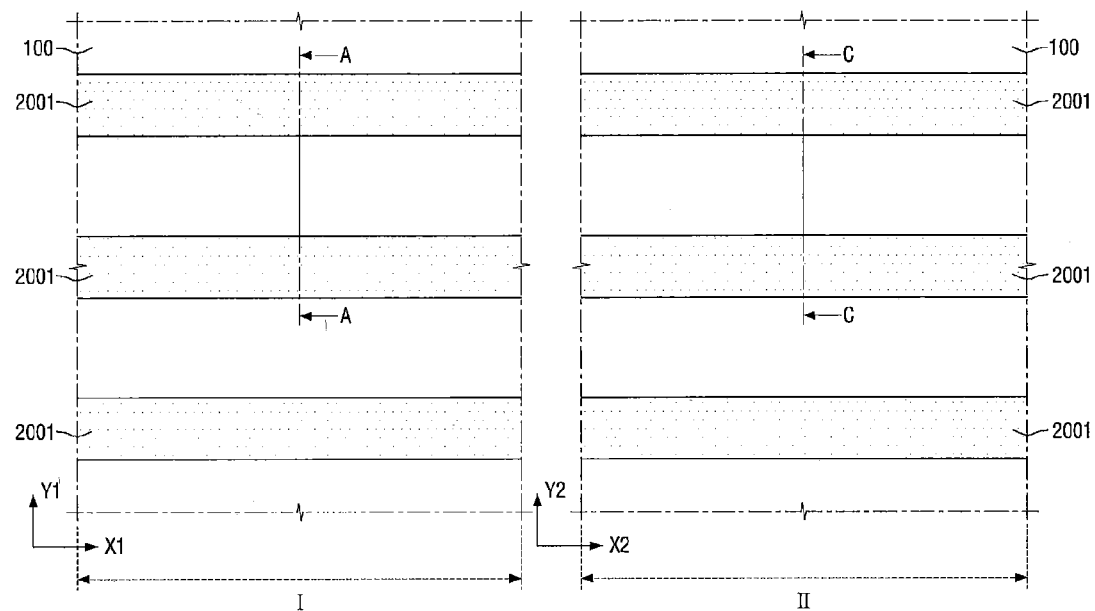
FIGS. 18 to 30 are intermediate-stage diagrams illustrating a method for fabricating a semiconductor device according to still another embodiment of the inventive concepts.
Figure 29:
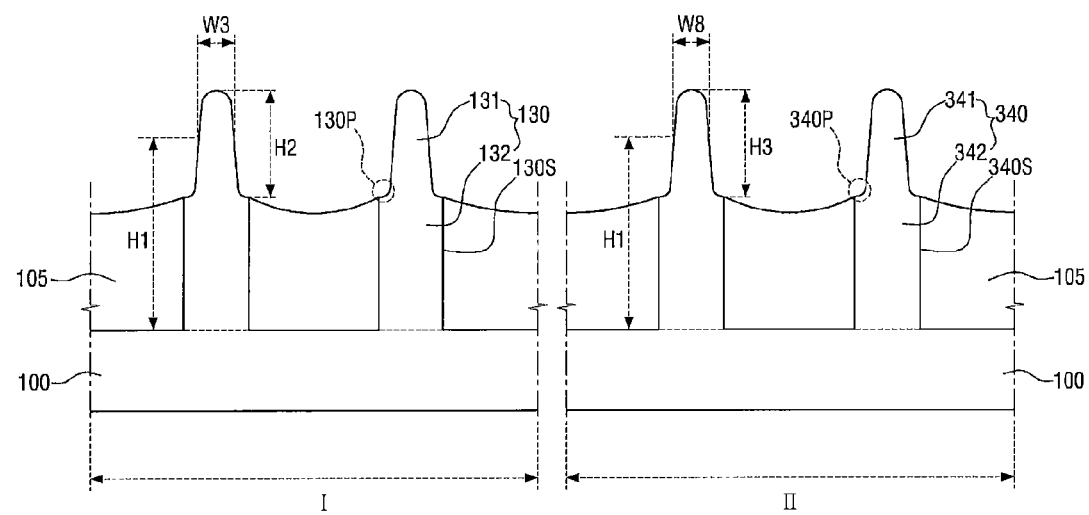
Figure 30:
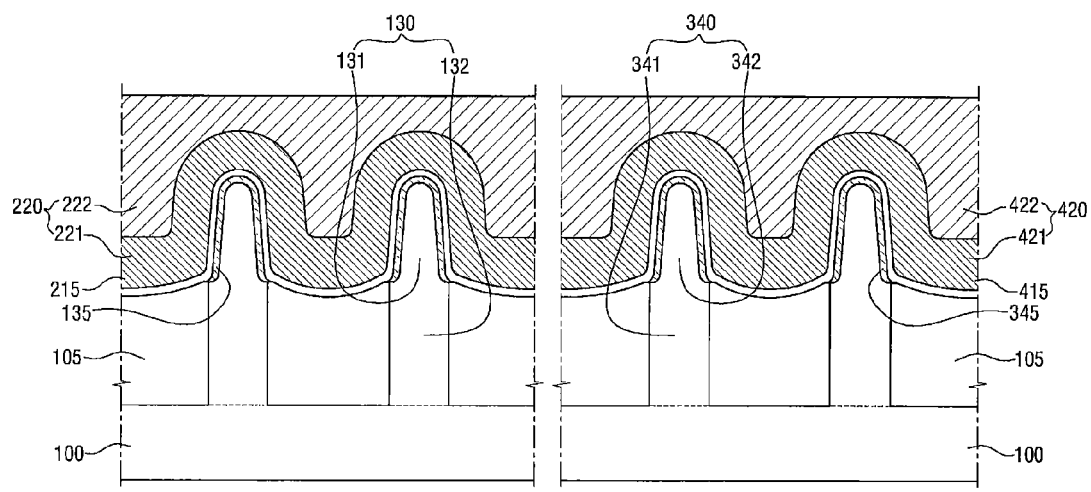

For reference, FIGS. 19 to 26 illustrate processes that are performed after FIG. 18 in a cross-section taken along a line A-A and a line C-C of FIG. 18. FIGS. 29 and 30 illustrate processes that are performed after FIG. 28A in a cross-section taken along a line A-A and a line C-C of FIG. 28A. FIG. 27B is a cross-sectional view taken along a line A-A and a line C-C of FIG. 27A, and FIG. 28B is a cross-sectional view taken along a line A-A and a line C-C of FIG. 28A.

Referring to FIG. 18, first mask patterns 2001 may be formed on the substrate 100. The first mask patterns 2001 may extend in the first direction X1 on a first region I and may extend in the third direction X2 on a second region II.

The substrate 100 can include the first region I and the second region II. The first region I and the second region II may be regions that are spaced apart from each other or may be regions that are connected to each other.

Figure 19:
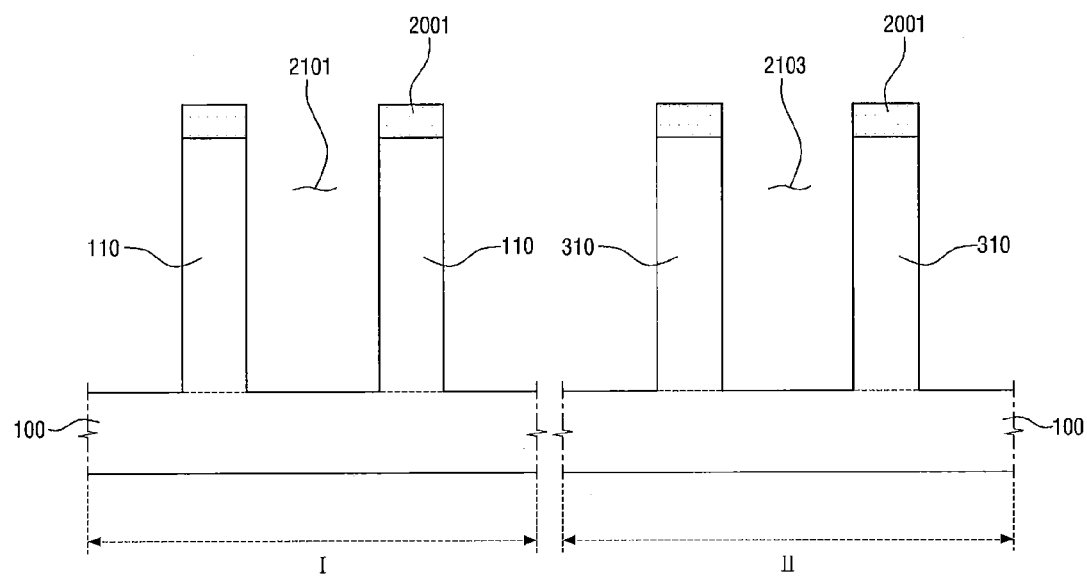

Referring to FIG. 19, a first trench 2101 and a third trench 2103 may be formed in the substrate 100 by etching portions of the substrate 100 that are not covered by the first mask patterns 2001. The first trench 2101 may be formed in the first region I, and the third trench 2103 may be formed in the second region II.

By etching a part of the substrate 100, first fin-shaped patterns 110 may be formed in the first region I of the substrate 100, and fifth fin-shaped patterns 310 may be formed in the second region II of the substrate 100.

Because the fin-shaped patterns are formed using the first mask patterns 2001 as an etching mask, the first fin-shaped patterns 110 extend in the first direction X1, and the fifth fin-shaped patterns 310 extend in the third direction X2.

The first mask patterns 2001 may remain on the first fin-shaped patterns 110 and on the fifth fin-shaped patterns 310.

Figure 20:
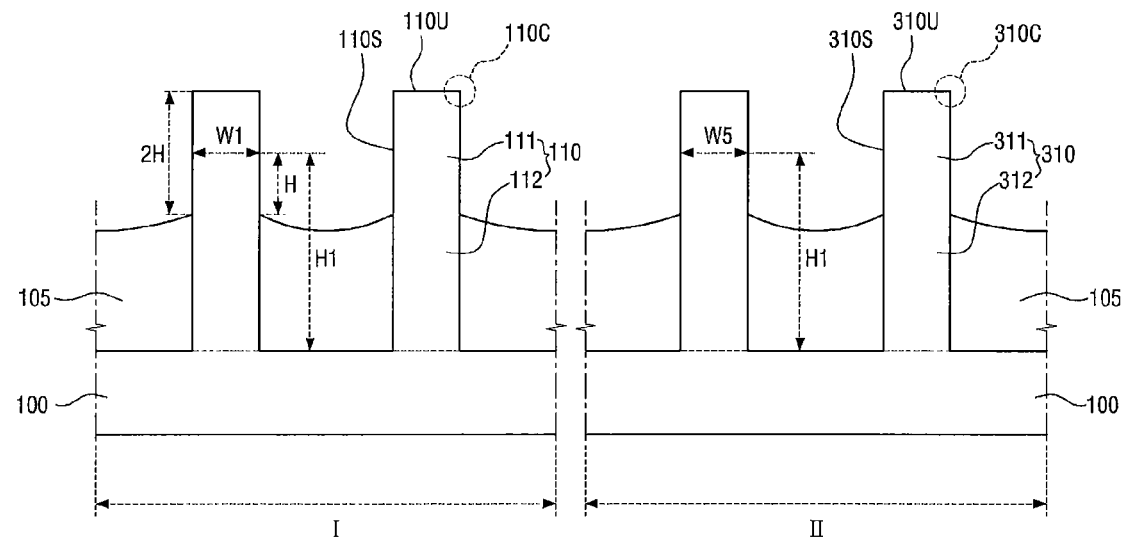

Referring to FIG. 20, the field insulating film 105 can be formed on a substrate 100. A part of the first fin-shaped pattern 110 and a part of the fifth fin-shaped pattern 310 may protrude above the upper surface of the field insulating film 105.

The lower part of the first fin-shaped pattern 112 may directly contact the field insulating film 105 and may be surrounded by the field insulating film 105. The upper part 111 of the first fin-shaped pattern may not directly contact the field insulating film 105.

The lower part 312 of the fifth fin-shaped pattern 310 may directly contact the field insulating film 105 and may be surrounded by the field insulating film 105. The upper part 311 of the fifth fin-shaped pattern may not directly contact the field insulating film 105.

A width of the first fin-shaped pattern 110 at a height H above the upper surface of the field insulating films 105 may be W1, and the width of the fifth fin-shaped pattern 310 may be W5. In other words, at a height H1 above the lowermost part of the first fin-shaped pattern 110, the width of the first fin-shaped pattern 110 may be a first width W1, and the width of the fifth fin-shaped pattern 310 may be a fifth width W5 at the same height H1.

The fifth fin-shaped pattern 310 includes an upper surface 310U, a sidewall 310S, and a corner portion 310C where the upper surface 310S and the sidewall 310C meet. As shown in FIG. 20, the corner portion 310C may have an angular shape.

Figure 21:
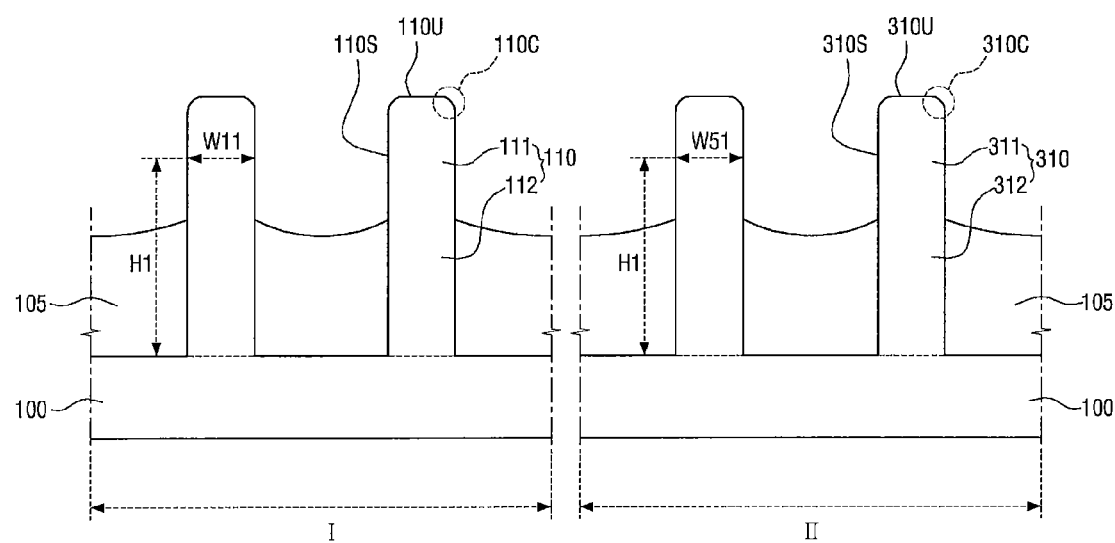

Referring to FIG. 21, through the etching process, the first fin-shaped pattern 110 may be etched to round the corner portion 110C thereof, and the fifth fin-shaped pattern 310 may be etched to round the corner portion 310C thereof.

A corrected fifth width of the fifth fin-shaped pattern 310 having the rounded corner portion at a height H1 above the lowermost part of the fifth fin-shaped pattern 310 may be W51.

In FIGS. 20 and 21, it has been described that at a height H1 above the lowermost part of the first fin-shaped pattern 110, the width W1 of the first fin-shaped pattern 110 before the rounding of the corner portion is substantially the same as the width W11 of the first fin-shaped pattern 110 after the rounding of the corner portion, and at a height H1 above the lowermost part of the fifth fin-shaped pattern 310, the width W5 of the fifth fin-shaped pattern 310 before the rounding of the corner portion is substantially the same as the width W51 of the fifth fin-shaped pattern 310 after the rounding of the corner portion, but it will be appreciated that embodiments of the inventive concepts are not limited thereto.

Figure 22:
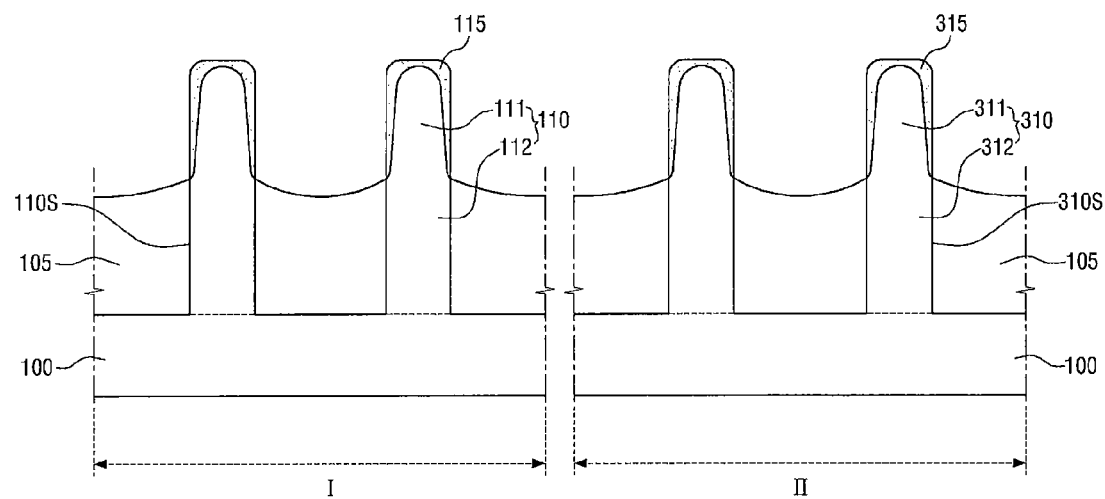

Referring to FIG. 22, the first oxide film 115 may be formed along the profile of the first fin-shaped pattern 110, and a fifth oxide film 315 may be formed along the profile of the fifth fin-shaped pattern 310.

The fifth oxide film 315 may be formed along the profile of the upper part 311 of the fifth fin-shaped pattern that protrudes above the upper surface of the field insulating film 105 and that includes the rounded corner portion.

The first oxide film 115 may be formed by oxidizing a portion of the first fin-shaped pattern 110, and the fifth oxide film 315 may be formed by oxidizing a portion of the fifth fin-shaped pattern 310.

The first oxide film 115 and the fifth oxide film 315 may be formed by, for example, chemical oxidation, UV oxidation, dual plasma oxidation, thermal oxidation, chemical vapor deposition, atomic layer deposition or the like.

Figure 23:
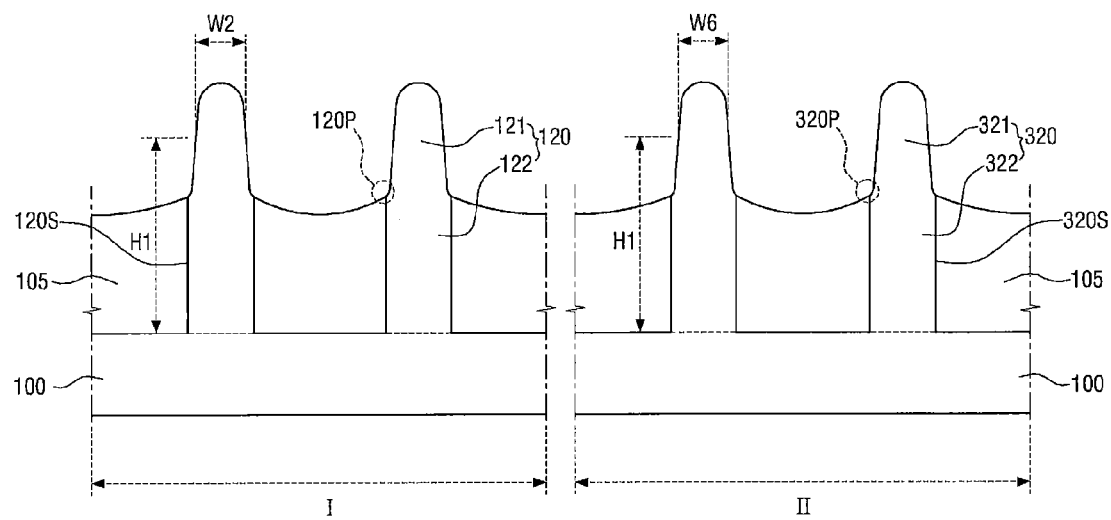

Referring to FIG. 23, the second fin-shaped pattern 120 may be formed in the first region I by removing the first oxide film 115, and the sixth fin-shaped pattern 320 may be formed in the second region II by removing the fifth oxide film 315.

The first oxide film 115 and the fifth oxide film 315 may be removed using an etching process. The first oxide film 115 and the fifth oxide film 315 may be removed by, for example, a chemical oxide film removal (COR), Siconi or descum.

The lower part of the sixth fin-shaped pattern 322 may directly contact the field insulating film 105 and may be surrounded by the field insulating film 105. The upper part 321 of the sixth fin-shaped pattern may not directly contact the field insulating film 105.

A width of the sixth fin-shaped pattern 320 at a height H1 above the lowermost part of the sixth fin-shaped pattern 320, may be a sixth width W6. The sixth width W6 of the sixth fin-shaped pattern 320 may be narrower than the fifth width W5 of the fifth fin-shaped pattern 310 before the rounding and the width W51 of the fifth fin-shaped pattern 310 after the rounding.

With reference to FIGS. 22 and 23, the second fin-shaped pattern 120 and the sixth fin-shaped pattern 320 may be formed by removing respective portions of the first fin-shaped pattern 110 and of the fifth fin-shaped pattern 310. Specifically, the second fin-shaped pattern 120 and the sixth fin-shaped pattern 320 may be formed by removing respective portions of the upper part 111 of the first fin-shaped pattern and of the upper part 311 of the fifth fin-shaped pattern.

In the course of forming and removing the first oxide film 115 and the fifth oxide film 315, the profiles of the sidewall 110S of the first fin-shaped pattern and the sidewall 310S of the fifth fin-shaped pattern change. In particular, the sidewall 320S of the sixth fin-shaped pattern may include a fourth inflection point 320P.

Figure 24:
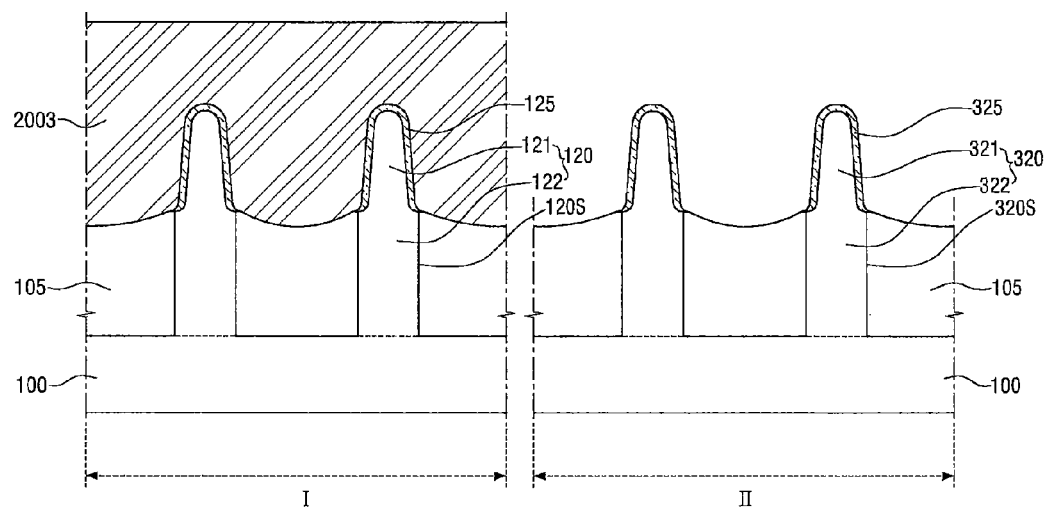

Referring to FIG. 24, the second oxide film 125 may be formed along the profile of the second fin-shaped pattern 120, and a sixth oxide film 325 may be formed along the profile of the sixth fin-shaped pattern 320. The second oxide film 125 and the sixth oxide film 325 may be formed along the respective profiles of the upper part 121 of the second fin-shaped pattern and the upper part 321 of the sixth fin-shaped pattern that protrude above the upper surface of the field insulating film 105.

The second oxide film 125 may be formed by oxidizing a portion of the upper part 121 of the second fin-shaped pattern, and the sixth oxide film 325 may be formed by oxidizing a portion of the upper part 321 of the sixth fin-shaped pattern.

Subsequently, a third mask pattern 2003 may be formed to cover the second fin-shaped pattern 120 on the first region I of the substrate 100. The second oxide film 125 is also covered by the third mask pattern 2003.

Since the third mask pattern 2003 is formed on the first region I, the sixth fin-shaped pattern 320 and the sixth oxide film 325 may be exposed by the third mask pattern 2003.

Figure 25:
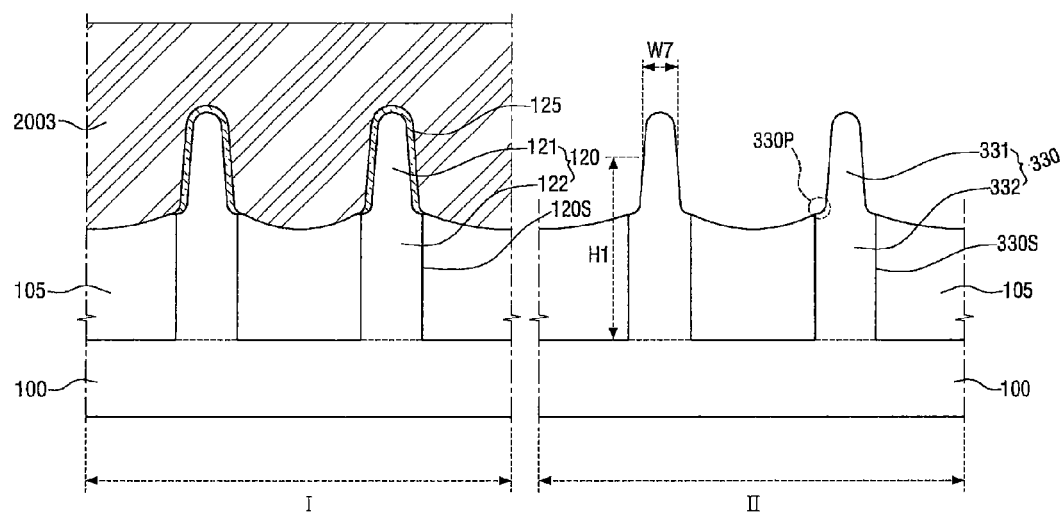

Referring to FIG. 25, the sixth oxide film 325 may be removed via an etching process using the third mask pattern 2003 as an etching mask. By removing the sixth oxide film 325, a seventh fin-shaped pattern 330 may be formed on the second region II. The sixth oxide film 325 may be removed using, for example, a chemical oxide removal (COR), Siconi or descum.

The seventh fin-shaped pattern 330 may include a lower part 332 and an upper part 331 that is above the lower part 332. The lower part 332 of the seventh fin-shaped pattern 330 may directly contact the field insulating film 105 and may be surrounded by the field insulating film 105. The upper part 331 of the seventh fin-shaped pattern may not directly contact the field insulating film 105.

A width of the seventh fin-shaped pattern 330 at a height H1 above the lowermost part 330 of the seventh fin-shaped pattern may be a seventh width W7. The width W7 of the seventh fin-shaped pattern 330 may be narrower than the sixth width W6 of the sixth fin-shaped pattern 320 and the width W51 of the fifth fin-shaped pattern 310 after the rounding.

In other words, the width W7 of the upper part 331 of the seventh fin-shaped pattern can be narrower than the width W6 of the sixth fin-shaped pattern 320 and the width W51 of the fifth fin-shaped pattern 310 after the rounding.

With reference to FIGS. 24 and 25, a seventh fin-shaped pattern 330 may be formed by removing a portion of the sixth fin-shaped pattern 320. Specifically, the seventh fin-shaped pattern 330 may be formed by removing a part of the upper part 321 of the sixth fin-shaped pattern 330.

In the course of forming and removing the sixth oxide film 325, the profile of the sidewall 320S of the sixth fin-shaped pattern changes. Therefore, the seventh fin-shaped pattern 330 can be formed by modifying the profile of the sidewall 320S of the sixth fin-shaped pattern 320.

The sidewall 330S of the seventh fin-shaped pattern 330 may include a fifth inflection point 330P.

Figure 26:
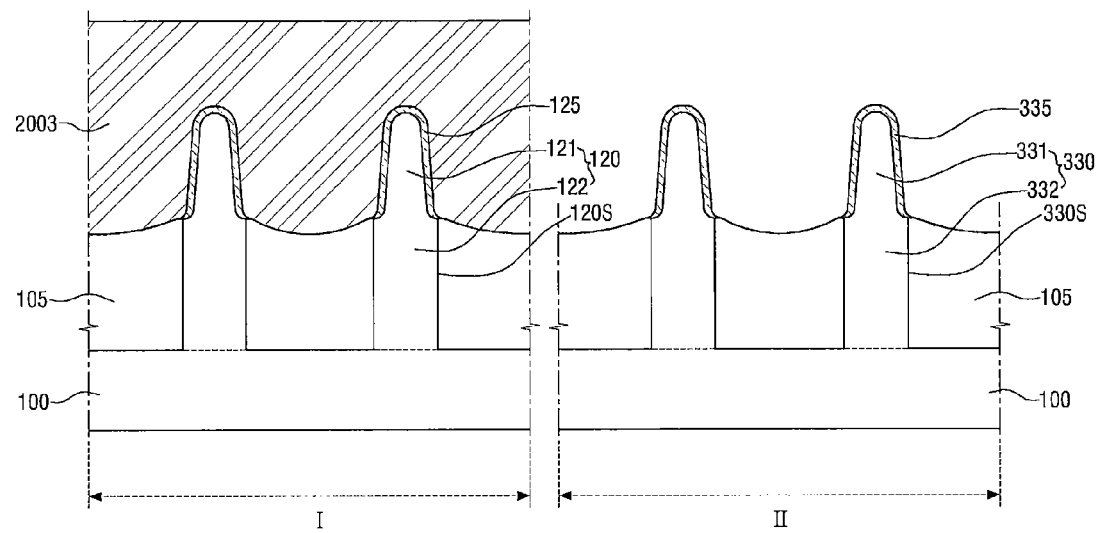
Figure 27A:
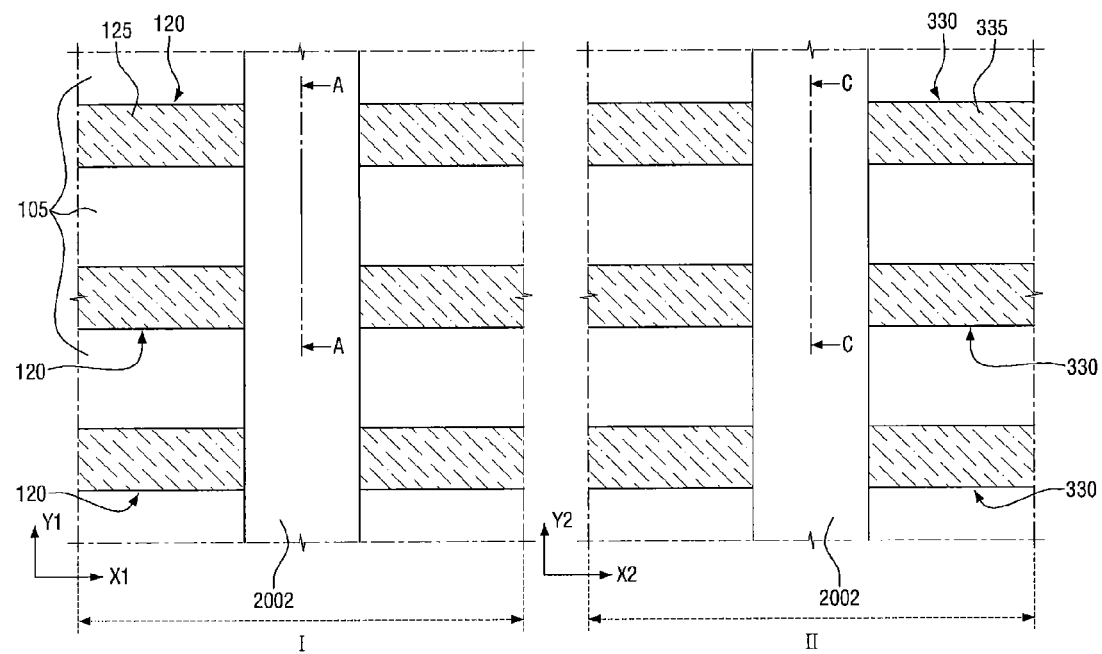
Figure 27B:
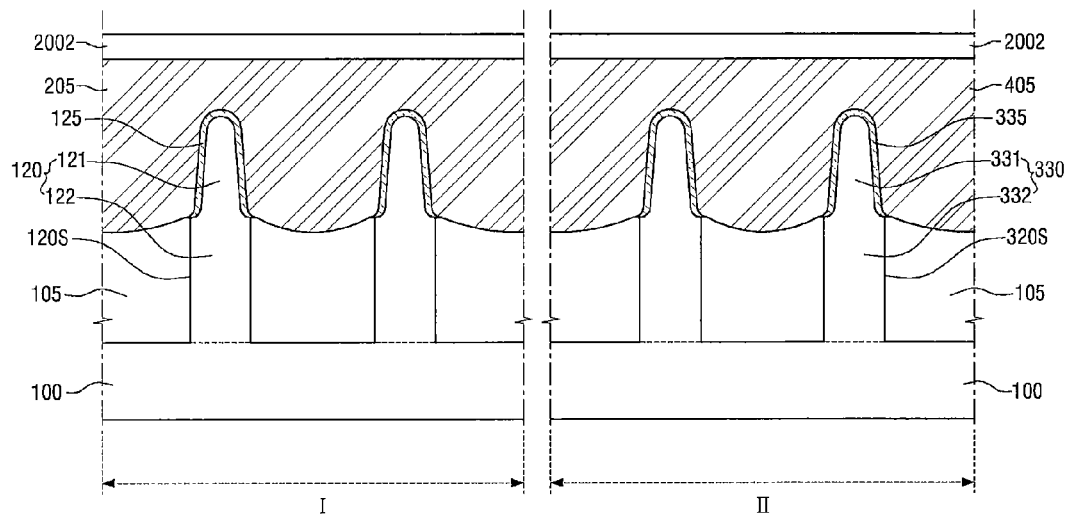

Referring to FIG. 26, a seventh oxide film 335 may be formed along the profile of the seventh fin-shaped pattern 330. The seventh oxide film 335 may be formed along the profile of the upper part 331 of the seventh fin-shaped pattern 330 that protrudes above the upper surface of the field insulating film 105.

The seventh oxide film 335 may be formed by oxidizing a part of the seventh fin-shaped pattern 330. For example, the seventh oxide film 335 may be formed by oxidizing a part of the upper part 331 of the seventh fin-shaped pattern 330.

The seventh oxide film 335 may be formed using, for example, chemical oxidation, UV oxidation, dual plasma oxidation, thermal oxidation, chemical vapor deposition or atomic layer deposition.

Subsequently, the third mask pattern 2003 may be removed to expose the second fin-shaped pattern 120 having the second oxide film 125 thereon.

In FIGS. 24 to 26, the third mask pattern 2003 has been described as being formed after forming the second oxide film 125 and the sixth oxide film 325, but embodiments of the inventive concepts are not limited thereto.

Unlike FIGS. 24 to 26, it is possible to form the third mask pattern 2003 without forming the second oxide film 125 and the sixth oxide film 325. In such a case, after forming the seventh fin-shaped pattern 330 while changing the profile of the sidewall 320S of the sixth fin-shaped pattern 320, the third mask pattern 2003 is removed. After removing the third mask pattern 2003, the second oxide film 125 and the seventh oxide film 335 may be formed along the profile of the second fin-shaped pattern 120 and the profile of the seventh fin-shaped pattern 330, respectively.

Referring to FIGS. 27A and 27B, a first dummy gate electrode 205 and a second dummy gate electrode 405 may be formed. In particular, a dummy gate electrode layer may be formed, and a mask pattern 2002 may be formed on the first dummy gate electrode layer. The first dummy gate electrode layer may then be etched using the mask 2002 as an etching mask to form the first dummy gate electrode 205 on the first region I and to form the second dummy gate electrode 405 on the second region II. The first dummy gate electrode 205 may extend in the second direction Y1 to intersect the second fin-shaped pattern 120, and the second dummy gate electrode 405 may extend in the fourth direction Y2 to intersect the seventh fin-shaped pattern 330.

The first dummy gate electrode 205 may be formed on the second oxide film 125 that is formed along the profile of the upper part 121 of the second fin-shaped pattern 120, and the second dummy gate electrode 405 may be formed on the seventh oxide film 335 that is formed along the profile of the upper part 331 of the seventh fin-shaped pattern 330.

In FIGS. 27A and 27B, it has been illustrated that the second oxide film 125 is exposed on both sides of the first dummy gate electrode 205 extending in the second direction Y1 and the seventh oxide film 335 is exposed on both sides of the second dummy gate electrode 405 extending in the fourth direction Y2, but embodiments of the inventive concepts are not limited thereto.

Subsequently, as described in FIGS. 9A to 11B, sources/drains are formed on both sides of the first dummy gate electrode 205 and on both sides of the second dummy gate electrode 405, respectively. Thereafter, the etch stop film 170 and the interlayer insulating film 180 are formed.

Subsequently, the interlayer insulating film 180 may be planarized until the upper surface of the first dummy gate electrode 205 and the upper surface of the second dummy gate electrode 405 are exposed.

Figure 28A:
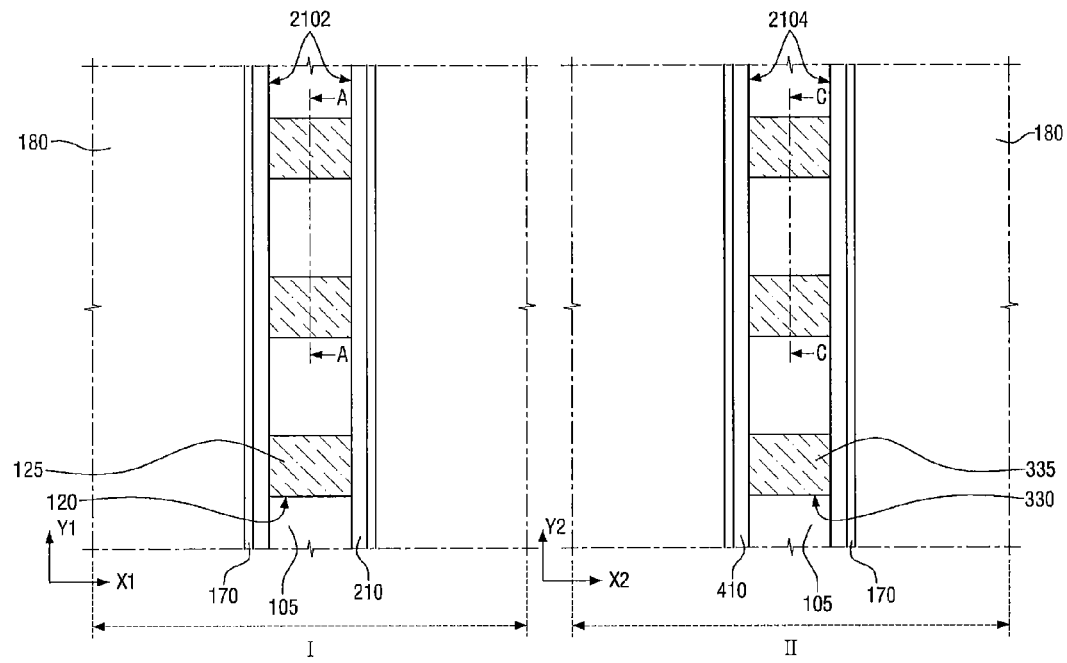
Figure 28B:
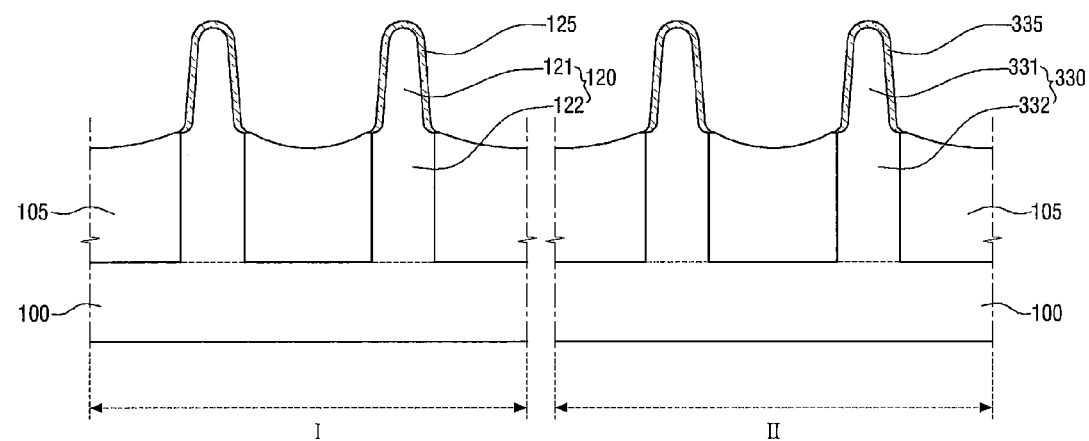

Referring to FIGS. 28A and 28B, the second trench 2102 extending in the second direction Y1 may be formed by removing the first dummy gate electrode 205, and a fourth trench 2104 extending in the fourth direction Y2 may be formed by removing the second dummy gate electrode 405.

As the fourth trench 2104 is formed, the field insulating film 105 may be exposed, and the seventh oxide film 335 formed along the profile of the upper part 331 of the seventh fin-shaped pattern 330 may be exposed. That is, the seventh oxide film 335 exposed by the fourth trench 2104 may be a portion which vertically overlaps the second dummy gate electrode 405.

Referring to FIG. 29, by removing the second oxide film 125 and the seventh oxide film 335, a third fin-shaped pattern 130 and an eighth fin-shaped pattern 340 are formed that protrude above the upper surface of the field insulating film 105.

Specifically, the third fin-shaped pattern 130 may be formed by removing a portion of the second oxide film 125 that is exposed by the second trench 2102, and the eighth fin-shaped pattern 340 may be formed by removing a portion of the seventh oxide film 335 that is exposed by the fourth trench 2104.

The second oxide film 125 and the seventh oxide film 335 can be removed using, for example, a chemical oxide removal (COR), Siconi or descum.

A lower part 342 of the eighth fin-shaped pattern may directly contact the field insulating film 105 and may be surrounded by the field insulating film 105. An upper part 341 of the eighth fin-shaped pattern may not directly contact the field insulating film 105.

A width of the eighth fin-shaped pattern 340 at a height H1 above the lowermost part of the eighth fin-shaped pattern 340 may be an eighth width W8. The width W8 of the eighth fin-shaped pattern 340 may be narrower than the width W7 of the seventh fin-shaped pattern 330 and may be narrower than the width W6 of the sixth fin-shaped pattern 320.

The eighth fin-shaped pattern 340 may be formed by removing a portion of the upper part 331 of the seventh fin-shaped pattern 330.

In the course of forming and removing the seventh oxide film 335, the profile of the sidewall 330S of the seventh fin-shaped pattern changes. Therefore, the eighth fin-shaped pattern 340 may be formed by modifying the profile of the sidewall 330S of the seventh fin-shaped pattern 330. The eighth fin-shaped pattern 340 may be formed by modifying the profile of the sidewall 330S of the seventh fin-shaped pattern 330 that vertically overlaps the second dummy gate electrode 405.

The sidewall 340S of the eighth fin-shaped pattern 340 may include a sixth inflection point 340P.

In the above-described process, the third fin-shaped pattern 130 is formed through two modifying processes of the sidewall profile, and the eighth fin-shaped pattern 340 is formed through three modifying processes of the sidewall profile.

As illustrated in the drawings, each time the modifying process of the sidewall profile is performed, the width and height of the fin-shaped pattern that protrudes above the upper surface of the field insulating film 105 decrease.

The width W1 of the first fin-shaped pattern 110 is assumed to be substantially the same as the width W5 of the fifth fin-shaped pattern 310, and the height of the upper part 111 of the first fin-shaped pattern is assumed to be substantially the same as the height of the upper part 311 of the fifth fin-shaped pattern 310.

At this time, since the number of modifying process of the sidewall profile for forming the third fin-shaped pattern 130 is different from the number of modifying process of the sidewall profile for forming the eighth fin-shaped pattern 340, the width W3 of the third fin-shaped pattern 130 may be different from the width W8 of the eighth fin-shaped pattern 340. For example, the width W3 of the third fin-shaped pattern 130 may be greater than the width W8 of the eighth fin-shaped pattern 340.

Further, the height H2 of the upper part 131 of the third fin-shaped pattern 130 may be different from the height H3 of the upper part 341 of the eighth fin-shaped pattern 340. For example, the height H2 of the upper part of the third fin-shaped pattern 131 may be higher than the height H3 of the upper part 341 of the eighth fin-shaped pattern 340.

In addition, the slope 130S of the sidewall of the upper part 131 of the third fin-shaped pattern 130 of the portion higher than the second inflection point 130P may be different from the slope 340S of the sidewall of the upper part 341 of the eighth fin-shaped pattern 340 of the portion higher than the sixth inflection point 340P, where in each case the slope is measured with respect to the upper surface of the substrate 100. For example, the slope 130S of the sidewall of the upper part 131 of the third fin-shaped pattern 130 of the portion higher than the second inflection point 130P may be smaller than the slope 340S of the sidewall of the upper part 341 of the eighth fin-shaped pattern 340 of the portion higher than the sixth inflection point 340P.

That is, the slope 340S of the sidewall of the upper part 341 of the eighth fin-shaped pattern 340 of the portion higher than the sixth inflection point 340P can be nearly vertical as compared to the slope 130S of the sidewall of the upper part 131 of the third fin-shaped pattern 130 of the portion higher than the second inflection point 130P.

Referring to FIG. 30, the third oxide film 135 may be formed along the profile of the third fin-shaped pattern 130 that is exposed by the second trench 2102. The eighth oxide film 135 may be formed along the profile of the eighth fin-shaped pattern 340 that is exposed by the fourth trench 2104.

Subsequently, a first high dielectric constant insulating film 215 is formed along the sidewall and the bottom surface of the second trench 2102, and a second high dielectric constant insulating film 415 is formed along the sidewall and the bottom surface of the fourth trench 2104.

The second high dielectric constant insulating film 415 may be formed along the profiles of the field insulating film 105 and the portion of the eighth fin-shaped pattern 340 that protrudes above the field insulating film 105. The second high dielectric constant insulating film 415 may be formed on the eighth oxide film 345.

Subsequently, the first gate electrode 220 may be formed by filling the second trench 2102 with a conductive material, and the second gate electrode 420 may be formed by filling the fourth trench 2104 with the conductive material.

The first gate electrode 220 may be formed on the third fin-shaped pattern 130 that has the first high dielectric constant insulating film 215 thereon, and the second gate electrode 420 may be formed on the eighth fin-shaped pattern 340 that has the second high dielectric constant insulating film 415 thereon.

Figure 31:
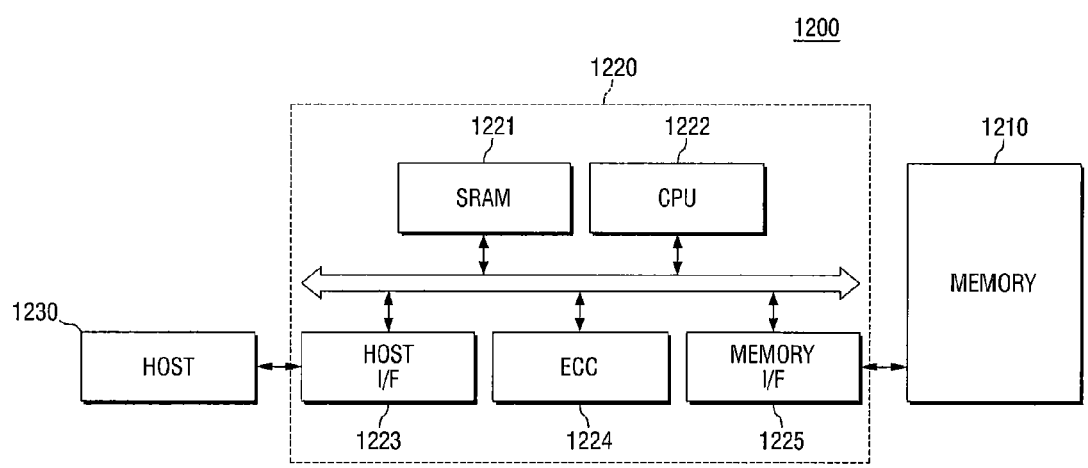
FIG. 31 is a block diagram of a memory card including a semiconductor device fabricated using a fabrication method according to embodiments of the inventive concepts.

FIG. 31 is a block diagram of a memory card which includes a semiconductor device fabricated according to embodiments of the inventive concepts.

Referring to FIG. 31, a memory 1210 that includes one or more semiconductor devices that are fabricated according to embodiments of the inventive concepts can be included in a memory card 1200. The memory card 1200 can include a memory controller 1220 which controls the data exchange between a host 1230 and the memory 1210. A SRAM 1221 can be used as an operation memory of a central processing unit 1222. A host interface 1223 can include a protocol for connecting the host 1230 to the memory card 1200 to exchange data. An error correction code 1224 can detect and correct errors in the data that is read from the memory 1210. A memory interface 1225 can interface with the memory 1210. The central processing unit 1222 can perform the overall control operation associated with the data exchange of the memory controller 1220.

Figure 32:
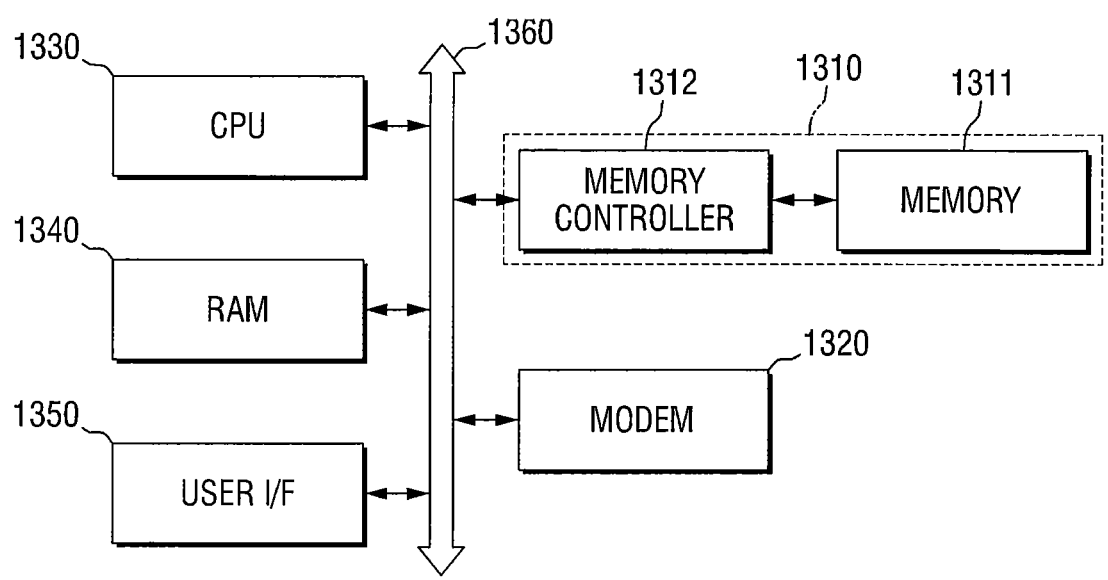
FIG. 32 is a block diagram of an information processing system including a semiconductor device fabricated using a fabrication method according to embodiments of the inventive concepts.

FIG. 32 is a block diagram of an information processing system that includes one or more semiconductor devices according to embodiments of the inventive concepts.

Referring to FIG. 32, an information processing system 1300 can include a memory system 1310 which includes the semiconductor devices fabricated according to embodiments of the inventive concepts. The information processing system 1300 can include a memory system 1310, a modem 1320, a central processing unit 1330, a RAM 1340 and a user interface 1350 that are electrically connected to a system bus 1360. The memory system 1310 can include a memory 1311 and a memory controller 1312 and can have substantially the same configuration as that of the memory card 1200 illustrated in FIG. 31. The data processed by the central processing unit 1330 or the data received from an external device can be stored in the memory system 1310. The information processing system 1300 can be applied to a memory card, a SSD, a camera image sensor and various other chipsets. For example, the memory system 1310 can be configured to adopt the SSD, and in this case, the information processing system 1300 can reliably and stably process a large-capacity data.

Figure 33:
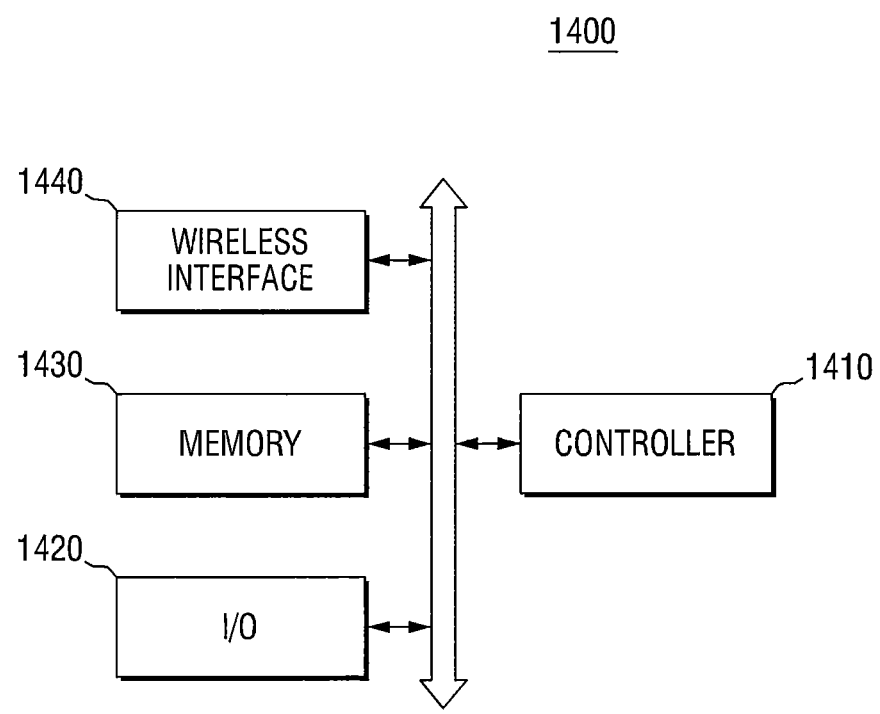
FIG. 33 is a block diagram of an electronic device including a semiconductor device fabricated using a fabrication method according to embodiments of the inventive concepts.

FIG. 33 is a block diagram of an electronic device that includes one or more semiconductor devices according to embodiments of the inventive concepts.

Referring to FIG. 33, an electronic device 1400 can include the semiconductor devices according to embodiments of the inventive concepts. The electronic device 1400 can be used for a wireless communication device (e.g., a PDA, a notebook computer, a laptop computer, a web tablet, a wireless telephone and/or a wireless digital music player) or various devices which transmit and receive information in a wireless communication environment.

The electronic device 1400 can include a controller 1410, an input/output device 1420, a memory 1430 and a wireless interface 1440. Here, the memory 1430 can include a semiconductor device fabricated according to embodiments of the inventive concepts. The controller 1410 can include a microprocessor, a digital signal processor or a similar processor. The memory 1430 can be used to store the commands (or user data) which are processed by the controller 1410.

The wireless interface 1440 can be used to transmit and receive the data through the wireless data network. The wireless interface 1440 can include an antenna and/or a wireless transceiver. The electronic device 1400 can utilize, for example, a third generation communication system protocol, such as a CDMA, a GSM, a NADC, an E-TDMA, a WCDMA and a CDMA 2000.

While the inventive concepts have been particularly shown and described with reference to exemplary embodiments thereof, it will be understood by those of ordinary skill in the art that various changes in form and details may be made therein without departing from the spirit and scope of the inventive concepts as defined by the following claims. It is therefore desired that the present embodiments be considered in all respects as illustrative and not restrictive, reference being made to the appended claims rather than the foregoing description to indicate the scope of the inventive concepts.

What is claimed is:

1. A method for fabricating a semiconductor device, the method comprising:
    forming a first fin-shaped pattern which has an upper part that protrudes above an upper surface of a field insulating film, and a lower part that is surrounded by the field insulating film;
    etching corner portions of the first fin-shaped pattern at which an upper surface and sidewalls of the first fin-shaped pattern meet to round the corner portions of the first fin-shaped pattern;
    forming a second fin-shaped pattern by modifying a profile of the sidewalls of the first fin-shaped pattern that include the rounded corner portions;
    forming a dummy gate electrode that intersects the second fin-shaped pattern on the second fin-shaped pattern; and
    forming a third fin-shaped pattern by modifying a profile of sidewalls of the second fin-shaped pattern.

2. The method of claim 1, wherein forming the second fin-shaped pattern includes
    forming a first oxide film along the profile of the upper part of the first fin-shaped pattern that includes the rounded corner portion by oxidizing a portion of the upper part of the first fin-shaped pattern, and
    removing the first oxide film.

3. The method of claim 1, wherein forming the third fin-shaped pattern includes
    forming a second oxide film along a profile of an upper part of the second fin-shaped pattern by oxidizing a portion of the upper part of the second fin-shaped pattern before forming the dummy gate electrode; and
    removing at least a portion of the second oxide film after forming the dummy gate electrode to form the third fin-shaped pattern.

4. The method of claim 3, further comprising forming a trench exposing the portion of the second oxide film by removing the dummy gate electrode prior to removing at least a portion of the second oxide film.

5. The method of claim 4, further comprising:
    forming a third oxide film along a profile of the third fin-shaped pattern that is exposed by the trench; and
    forming a gate electrode in the trench on the third oxide film.

6. The method of claim 1, wherein a width of an upper part of the second fin-shaped pattern at a first height above a lower surface of the substrate is smaller than a width of the upper part of the first fin-shaped pattern at the first height and is greater than a width of an upper part of the third fin-shaped pattern at the first height.

7. The method of claim 1, wherein the dummy gate electrode vertically overlaps sidewalls of the second fin-shaped pattern.

8. A method for fabricating a semiconductor device, the method comprising:
    forming a first fin-shaped pattern including an upper part and a lower part in a first region on a substrate, and forming a second fin-shaped pattern including an upper part and a lower part in a second region on the substrate;
    forming a third fin-shaped pattern by removing a portion of the upper part of the first fin-shaped pattern;
    forming a fourth fin-shaped pattern by removing a portion of the upper part of the second fin-shaped pattern;
    forming a first oxide film along a profile of the third fin-shaped pattern by oxidizing a portion of an upper part of the third fin-shaped pattern;
    forming a second oxide film along a profile of the fourth fin-shaped pattern by oxidizing a portion of an upper part of the fourth fin-shaped pattern;
    forming a mask pattern on the first region of the substrate, the mask pattern covering the third fin-shaped pattern with the first oxide film thereon;
    forming a fifth fin-shaped pattern by removing the second oxide film;
    forming a third oxide film along a profile of the fifth fin-shaped pattern by oxidizing a portion of an upper part of the fifth fin-shaped pattern;
    removing the mask pattern;
    after removal of the mask pattern, forming a first dummy gate electrode that intersects the third fin-shaped pattern on the first oxide film and forming a second dummy gate electrode that intersects the fifth fin-shaped pattern on the third oxide film; and
    after forming the first and second dummy gate electrodes, forming a sixth fin-shaped pattern by removing at least a portion of the first oxide film and forming a seventh fin-shaped pattern by removing at least a portion of the third oxide film.

9. The method of claim 8, wherein forming the third fin-shaped pattern comprises forming a fourth oxide film along a profile of the upper part of the first fin-shaped pattern and then removing the fourth oxide film, and wherein forming the fourth fin-shaped pattern comprises forming a fifth oxide film along a profile of the upper part of the second fin-shaped pattern and then removing the fifth oxide film.

10. The method of claim 8, wherein the first fin-shaped pattern includes sidewalls, an upper surface and corner portions at which the sidewalls and the upper surface of the first fin-shaped pattern meet,
    the second fin-shaped pattern includes sidewalls, an upper surface and corner portions at which the sidewalls and the upper surface of the second fin-shaped pattern meet,
    the method further comprising:
    before forming the third fin-shaped pattern and the fourth fin-shaped pattern, rounding the corner portions of the first fin-shaped pattern and the corner portions of the second fin-shaped pattern.

11. The method of claim 10, further comprising:
    before rounding the corner portions of the first fin-shaped pattern and the corner portions of the second fin-shaped pattern, forming a field insulating film on the substrate, wherein the upper part of the first fin-shaped pattern and the upper part of the second fin-shaped protrude above an upper surface of the field insulating film.

12. The method of claim 8, wherein the forming of the sixth fin-shaped pattern and the seventh fin-shaped pattern includes
- forming a first trench and a second trench which expose each of the first oxide film and the third oxide film by removing the first dummy gate electrode and the second dummy gate electrode, and
- removing the first oxide film and the third oxide film which are exposed by the respective first and second trenches.

13. The method of claim 12, further comprising:
- forming a fourth oxide film and a fifth oxide film along respective profiles of an upper part of the sixth fin-shaped pattern and of an upper part of the seventh fin-shaped pattern; and
- forming a first gate electrode filling the first trench on the fourth oxide film and a second gate electrode filling the second trench on the fifth oxide film.

\* \* \* \* \*